United States Patent
Chen et al.

(10) Patent No.: US 11,293,974 B2
(45) Date of Patent: Apr. 5, 2022

(54) SYSTEM AND METHOD FOR SEMICONDUCTOR DEVICE TESTING

(71) Applicant: Taiwan Semiconductor Manufacturing Company, Ltd., Hsinchu (TW)

(72) Inventors: Hao Chen, New Taipei (TW); Mill-Jer Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/867,999

(22) Filed: May 6, 2020

(65) Prior Publication Data

US 2021/0096173 A1 Apr. 1, 2021

Related U.S. Application Data

(60) Provisional application No. 62/906,962, filed on Sep. 27, 2019.

(51) Int. Cl.
G01R 31/28 (2006.01)

(52) U.S. Cl.
CPC ..... *G01R 31/2886* (2013.01); *G01R 31/2801* (2013.01)

(58) Field of Classification Search
CPC .. G01R 31/2886; G01R 31/2801; H01L 21/66
See application file for complete search history.

(56) References Cited

U.S. PATENT DOCUMENTS

| 6,288,561 B1* | 9/2001 | Leedy .............. H01L 21/67138 324/750.07 |
| 8,373,428 B2* | 2/2013 | Eldridge .............. B23K 20/004 324/754.14 |
| 2006/0024990 A1* | 2/2006 | Ahmad ................ G01R 1/0483 439/71 |
| 2018/0156868 A1* | 6/2018 | Batz ................... G01R 31/3172 |
| 2020/0041564 A1* | 2/2020 | Cojocneanu ......... G01R 31/275 |

* cited by examiner

*Primary Examiner* — Akm Zakaria
(74) *Attorney, Agent, or Firm* — Slater Matsil, LLP

(57) ABSTRACT

A testing system includes a load board that includes a first circuit board, a first external connector attached to the first circuit board, and a thermal module configured to hold a system-on-wafer structure including a connector and a socket, a connector structure including a second circuit board, wherein the second circuit board is electrically connected to the first external connector, and a second external connector configured to connect to the connector of the system-on-wafer structure, and a test structure configured to connect to the socket of the system-on-wafer structure, the test structure including a third circuit board and pins, wherein adjacent pairs of pins of the test structure are electrically coupled through the third circuit board to form a continuous conductive path extending alternately between the system-on-wafer structure and the adjacent pairs of pins of the test structure.

20 Claims, 24 Drawing Sheets

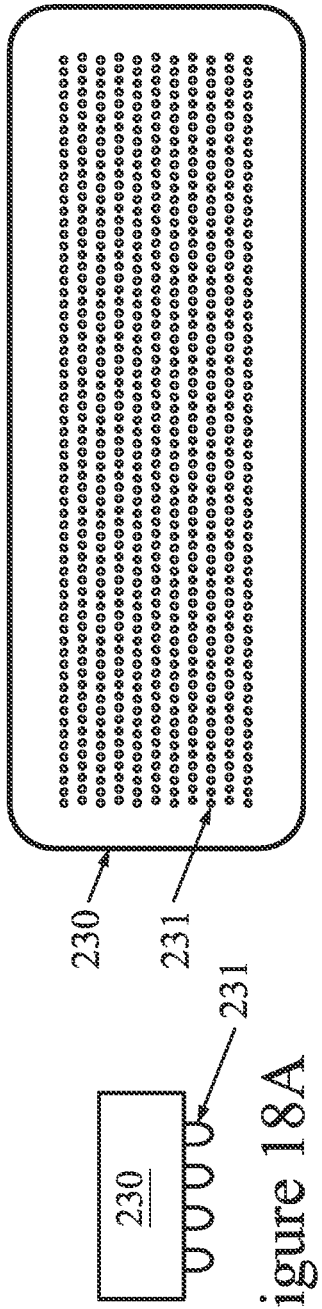
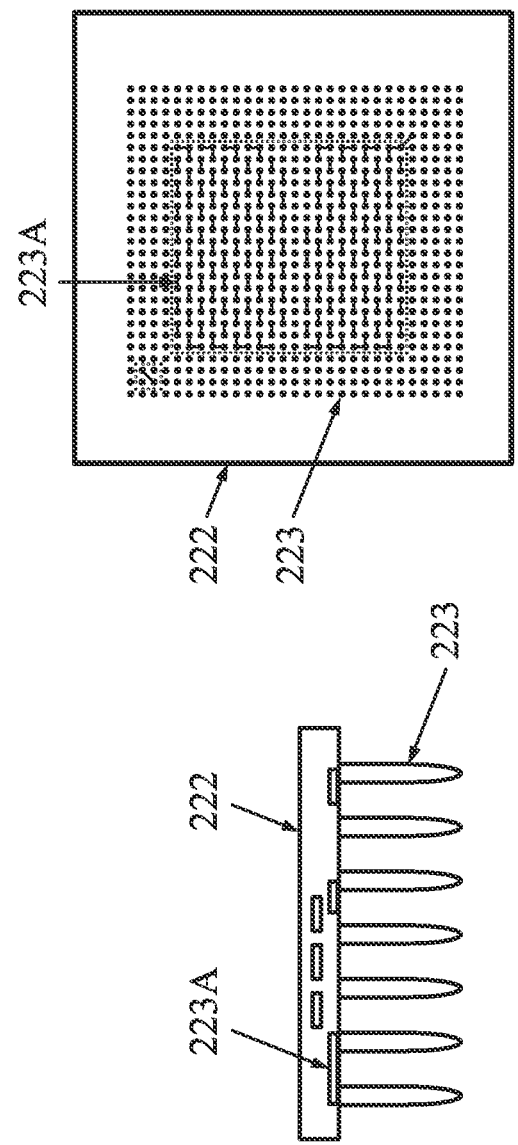

SYSTEM AND METHOD FOR SEMICONDUCTOR DEVICE TESTING

PRIORITY CLAIM AND CROSS-REFERENCE

This application claims the benefit of U.S. Provisional Application No. 62/906,962, filed on Sep. 27, 2019, which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 18A and 18B illustrate a cross-sectional view and a plan view of a test connector of a test system, in accordance with some embodiments.

FIGS. 19A and 19B illustrate a cross-sectional view and a plan view of a test substrate of a test system, in accordance with some embodiments.

DETAILED DESCRIPTION

Figure 1:
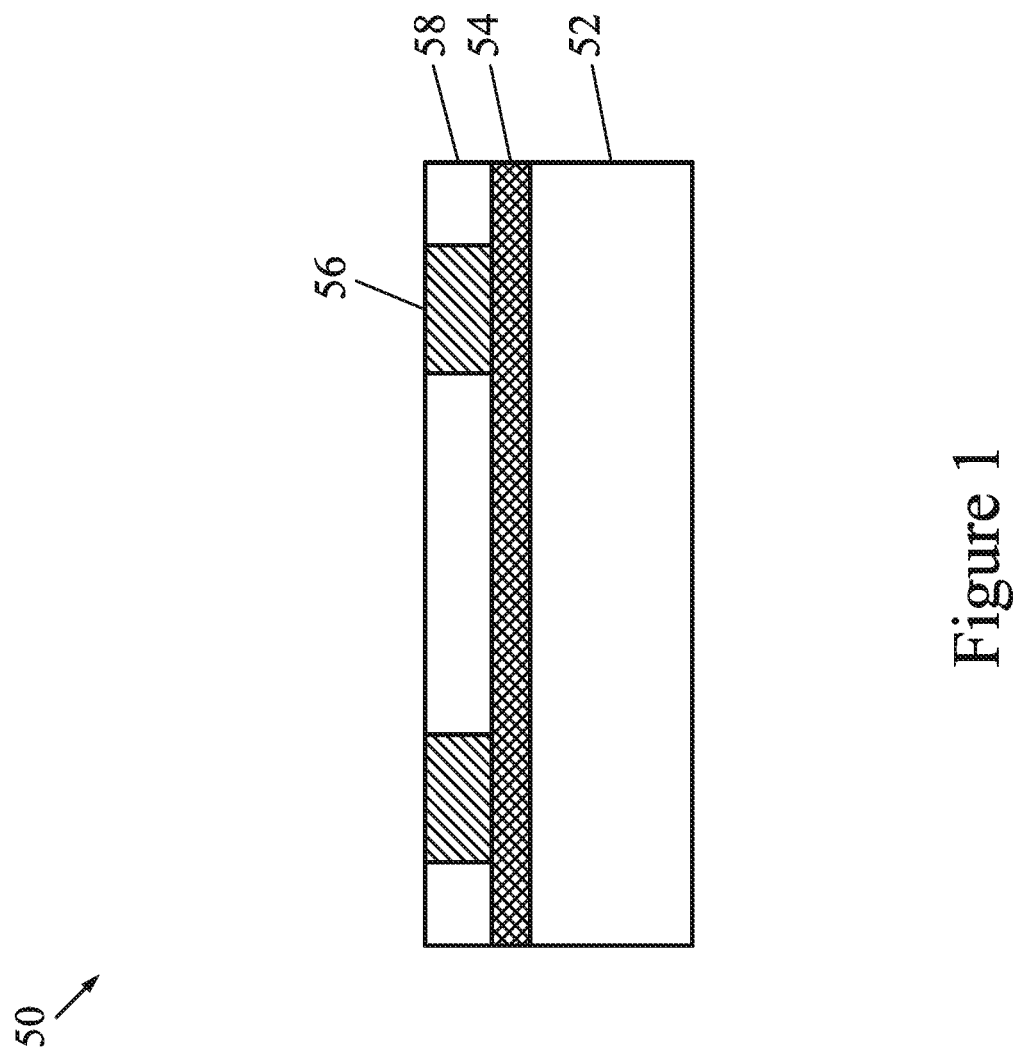
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, this disclosure describes a system for performing electrical testing on a large device, such as a system-on-wafer (SoW) device or the like. Embodiments of the testing system described herein include connector structures that interface with connectors of the device and test structures that connect to sockets of the device. The test system allows for system-scale electrical testing (e.g., "wafer-scale testing") the device. For example, the device may be completely processed when the electrical testing is performed. This allows the connections of components connected at the end of processing (e.g., connectors or sockets) to be tested. Additionally, the test system herein allows for various types of electrical testing to be performed over regions of the device or over the entire device, such as connector continuity tests. This can improve testing efficiency and facilitate the identification of defects.

FIG. 1 illustrates a cross-sectional view of an integrated circuit die 50, in accordance with some embodiments. The integrated circuit die 50 will be packaged in subsequent processing to form an integrated circuit package component. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, a high bandwidth memory (HBM) die, a magnetic random access memory (MRAM) die, etc.), a power management die (e.g., power management integrated circuit (PMIC) die), a radio frequency (RF) die, a sensor die, a micro-electro-mechanical-system (MEMS) die, a signal processing die (e.g., a digital signal processing (DSP) die or the like), a front-end die (e.g., analog front-end (AFE) dies), an application-specific die (e.g., an application-specific integrated circuit (ASIC), a field-programmable gate array (FPGA), etc.), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side. Devices may be formed at the front surface of the semiconductor substrate 52. The devices may be active devices (e.g., transistors, diodes, etc.) or passive devices (e.g., capacitors, resistors, inductors, etc.).

An interconnect structure 54 is over the semiconductor substrate 52, and interconnects the devices to form an integrated circuit. The interconnect structure 54 may be formed by, for example, metallization patterns in dielectric layers on the semiconductor substrate 52. The metallization patterns include metal lines and vias formed in one or more low-k dielectric layers. The metallization patterns of the interconnect structure 54 are electrically coupled to the devices of the semiconductor substrate 52. The integrated circuit die 50 further includes pads, such as aluminum pads, to which external connections are made. The pads are on the active side of the integrated circuit die 50, such as in and/or on the interconnect structure 54. One or more passivation films may be on the integrated circuit die 50, such as on portions of the interconnect structure 54. Die connectors 56, such as conductive pillars (for example, formed of a metal such as copper), are physically and electrically coupled to the interconnect structure 54. The die connectors 56 may be formed by, for example, plating, or the like. The die connectors 56 electrically couple the respective integrated circuits of the integrated circuit die 50.

Optionally, solder regions (e.g., solder balls or solder bumps) may be disposed on the pads of the interconnect structure 54. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and packaging, and dies, which fail the CP testing, are not packaged. After testing, the solder regions may be removed in subsequent processing steps.

A dielectric layer 58 may (or may not) be formed on the active side of the integrated circuit die 50, such as on the passivation films and the die connectors 56. The dielectric layer 58 laterally encapsulates the die connectors 56, and the dielectric layer 58 is laterally coterminous with the integrated circuit die 50. Initially, the dielectric layer 58 may bury the die connectors 56, such that the topmost surface of the dielectric layer 58 is above the topmost surfaces of the die connectors 56. In some embodiments where solder regions are disposed on the die connectors 56, the dielectric layer 58 may also bury the solder regions. Alternatively, the solder regions may be removed prior to forming the dielectric layer 58.

The dielectric layer 58 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 58 may be formed, for example, by spin coating, lamination, chemical vapor deposition (CVD), or the like. In some embodiments, the die connectors 56 are exposed through the dielectric layer 58 during formation of the integrated circuit die 50. In some embodiments, the die connectors 56 remain buried and are exposed during a subsequent process for packaging the integrated circuit die 50. Exposing the die connectors 56 may remove any solder regions that may be present on the die connectors 56.

In some embodiments, the integrated circuit die 50 is a stacked device that includes multiple semiconductor substrates 52. For example, the integrated circuit die 50 may be a memory device such as a hybrid memory cube (HMC) device, a high bandwidth memory (HBM) device, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 54.

FIGS. 2-12 illustrate cross-sectional views of intermediate steps during a process for forming a package structure 100, in accordance with some embodiments. The package structure 100 may be a reconstructed wafer having multiple package regions, with one or more of the integrated circuit dies 50 being packaged in each of the package regions. The package regions include computing sites 102 and connecting sites 104. Each of the computing sites 102 may have e.g., logic functions, memory functions, or the like. Each of the connecting sites 104 may have, e.g., connectors 158 (discussed further below), and the computing sites 102 of the package structure 100 may connect to external systems through the connecting sites 104. The package structure 100 may be a single computing device comprising the computing sites 102 and connecting sites 104, such as a system-on-wafer (SOW) assembly. For example, the package structure 100 may be an artificial intelligence (AI), machine learning (ML), or deep learning (DL) accelerator, and each computing site 102 may be a neural network node for the accelerator. Example systems for the package structure 100 include AI servers, high-performance computing (HPC) systems, high power computing devices, cloud computing systems, edge computing systems, and the like.

As noted above, the package structure 100 may be part of a system-on-wafer assembly. As such, the package structure 100 may have relatively large dimensions. For example, the package structure 100 can have a surface area in excess of 10,000 mm$^2$. A large surface area allows for a large quantity of computing sites 102 and connecting sites 104. Two computing sites 102, e.g., computing sites 102A and 102B, and two connecting sites 104, e.g., connecting sites 104A and 104B, are illustrated in FIGS. 2-13, but it should be appreciated that the package structure 100 may include many computing sites 102 and connecting sites 104, and the sites may be laid out in a variety of arrangements or configurations. A plan view of an example arrangement of integrated circuit dies 50 is shown in FIG. 4, described in greater detail below.

Figure 2:
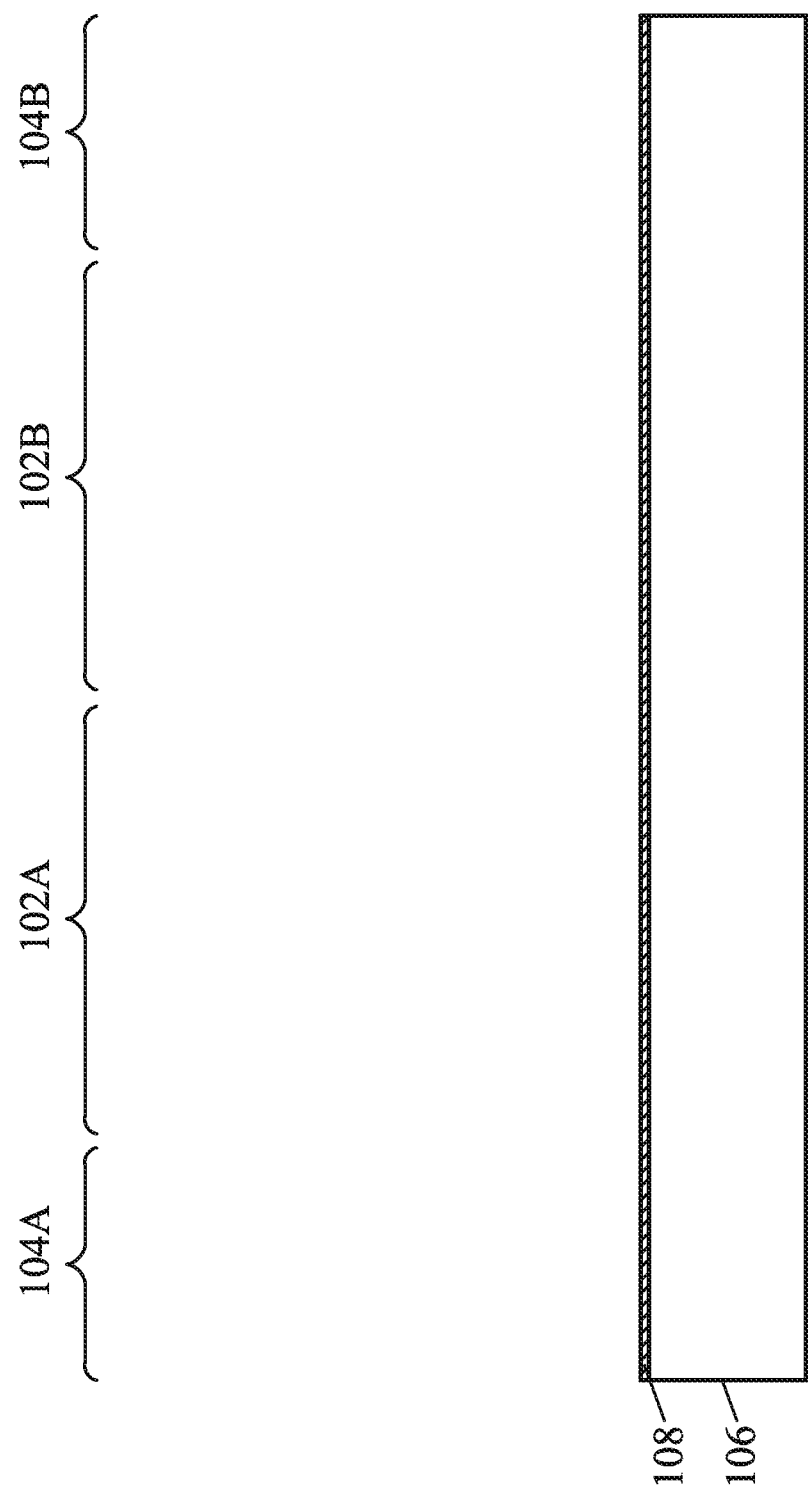
FIGS. 2 through 12 illustrate cross-sectional views of intermediate steps during a process for forming a package structure, in accordance with some embodiments.

In FIG. 2, a carrier substrate 106 is provided, and an adhesive layer 108 is formed on the carrier substrate 106, in accordance with some embodiments. The carrier substrate 106 may be a glass carrier substrate, a ceramic carrier substrate, or the like. The carrier substrate 106 may be a wafer, such that multiple packages can be formed on the carrier substrate 106 simultaneously. The adhesive layer 108 may be removed along with the carrier substrate 106 from the overlying structures that will be formed in subsequent steps. In some embodiments, the adhesive layer 108 is any suitable adhesive, epoxy, die attach film (DAF), or the like, and is applied over the surface of the carrier substrate 106.

Figure 3:
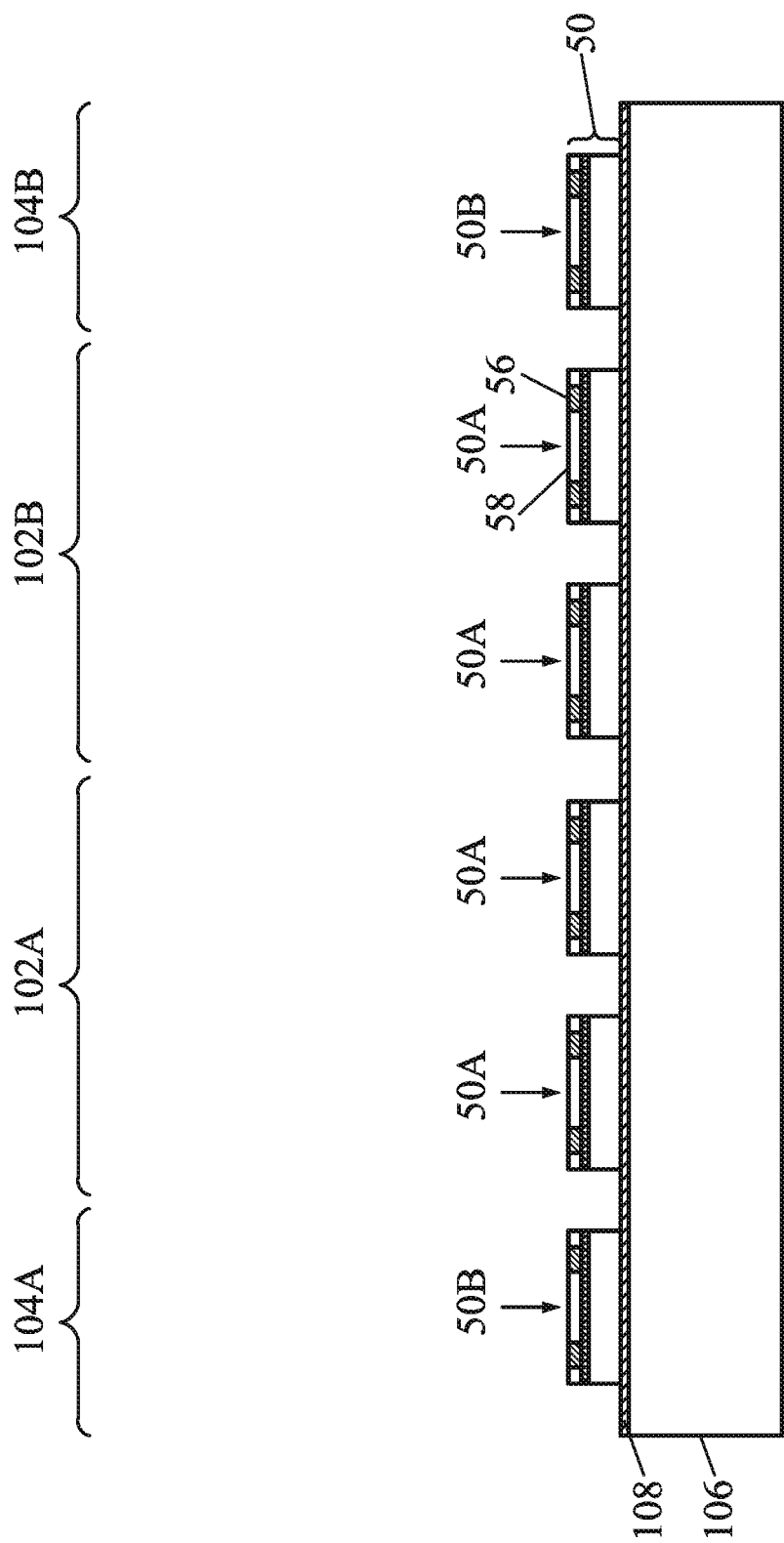
Figure 4:
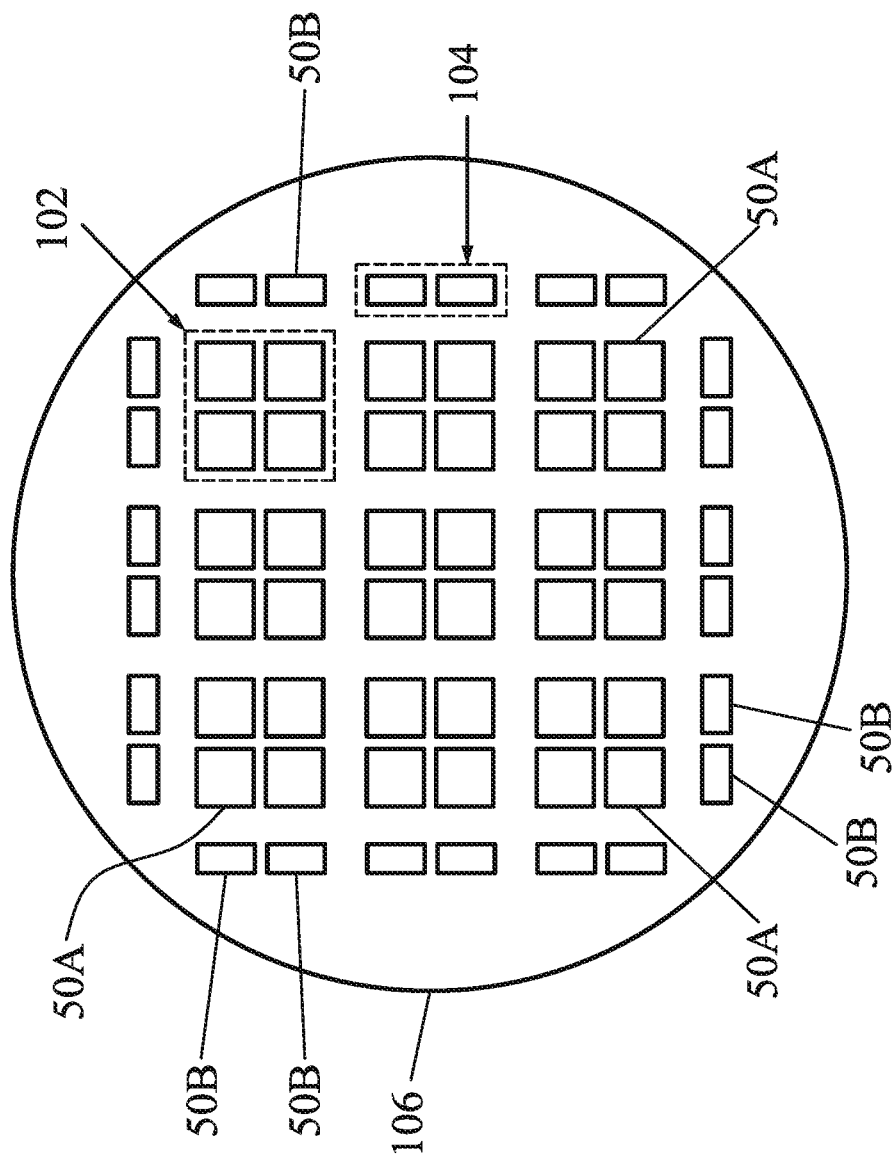

In FIG. 3, integrated circuit dies 50 are attached to the adhesive layer 108, in accordance with some embodiments. A desired type and quantity of integrated circuit dies 50 are attached in each of the computing sites 102A and 102B and the connecting sites 104A and 104B. In some embodiments, a first type of integrated circuit die, such as a SoC die 50A, is attached in the computing sites 102A and 102B, and a second type of integrated circuit die, such as an I/O interface die 50B, is attached in the connecting sites 104A and 104B. Although a single integrated circuit die 50 is illustrated in some sites, it should be appreciated that multiple integrated circuit dies may be attached adjacent one another in some or all of the sites. When multiple integrated circuit dies are attached in each site, they may be of the same technology node, or of different technology nodes. For example, the integrated circuit dies 50 may include dies formed at a 10 nm technology node, dies formed at a 7 nm technology node, the like, or combinations thereof. In some cases, the SoC dies 50A may be a different size than the I/O interface dies 50B. In some cases, the SoC dies 50A may include dies of different sizes, or the I/O interface dies 50B may include dies of different sizes.

In FIG. 4, a plan view of integrated circuit dies 50 arranged on a carrier substrate 106 is shown, in accordance with some embodiments. As shown in FIG. 4, multiple computing sites 102 may be arranged in an array-like configuration and may be surrounded by multiple connecting sites 104. Each computing site 102 may include multiple SoC dies 50A, and each connecting site 104 may include multiple I/O interface dies 50B. The arrangement of computing sites 102 and connecting sites 104 shown in FIG. 4 is an illustrative example, and more or fewer computing sites 102 or connecting sites 104 may be present. Each computing site 102 may contain more or fewer SoC dies 50A than shown, and each connecting site 104 may include more or fewer I/O interface dies 50B than shown. The SoC dies 50A or I/O interface dies 50B may also have different sizes or shapes than shown. Other configurations, arrangements, or layouts are possible.

Figure 5:
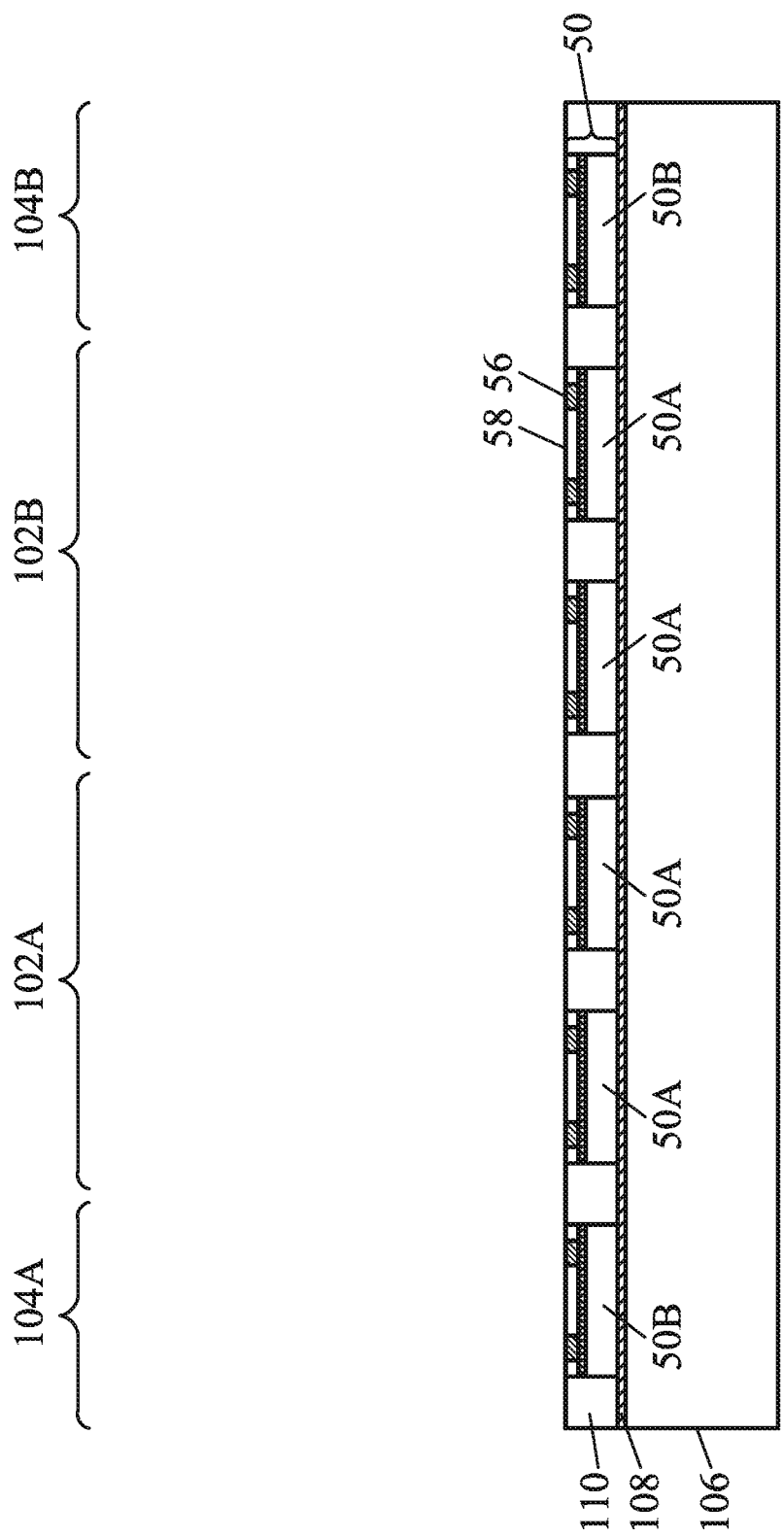

In FIG. 5, an encapsulant 110 is formed on and around the various components, in accordance with some embodiments. After formation, the encapsulant 110 encapsulates the integrated circuit dies 50. The encapsulant 110 may be a molding compound, epoxy, or the like, and may be applied by compression molding, transfer molding, or the like. The encapsulant 110 may be applied in liquid or semi-liquid form and then subsequently cured. In some embodiments, the encapsulant 110 is formed over the carrier substrate 106 such that the integrated circuit dies 50 are buried or covered, and a planarization process may then be performed on the encapsulant 110 to expose the die connectors 56 of the integrated circuit dies 50. Topmost surfaces of the encapsulant 110, die connectors 56, and/or dielectric layers 58 may be coplanar after the planarization process. The planarization process may include, for example, a chemical-mechanical polish (CMP) process or a grinding process.

Figure 6:
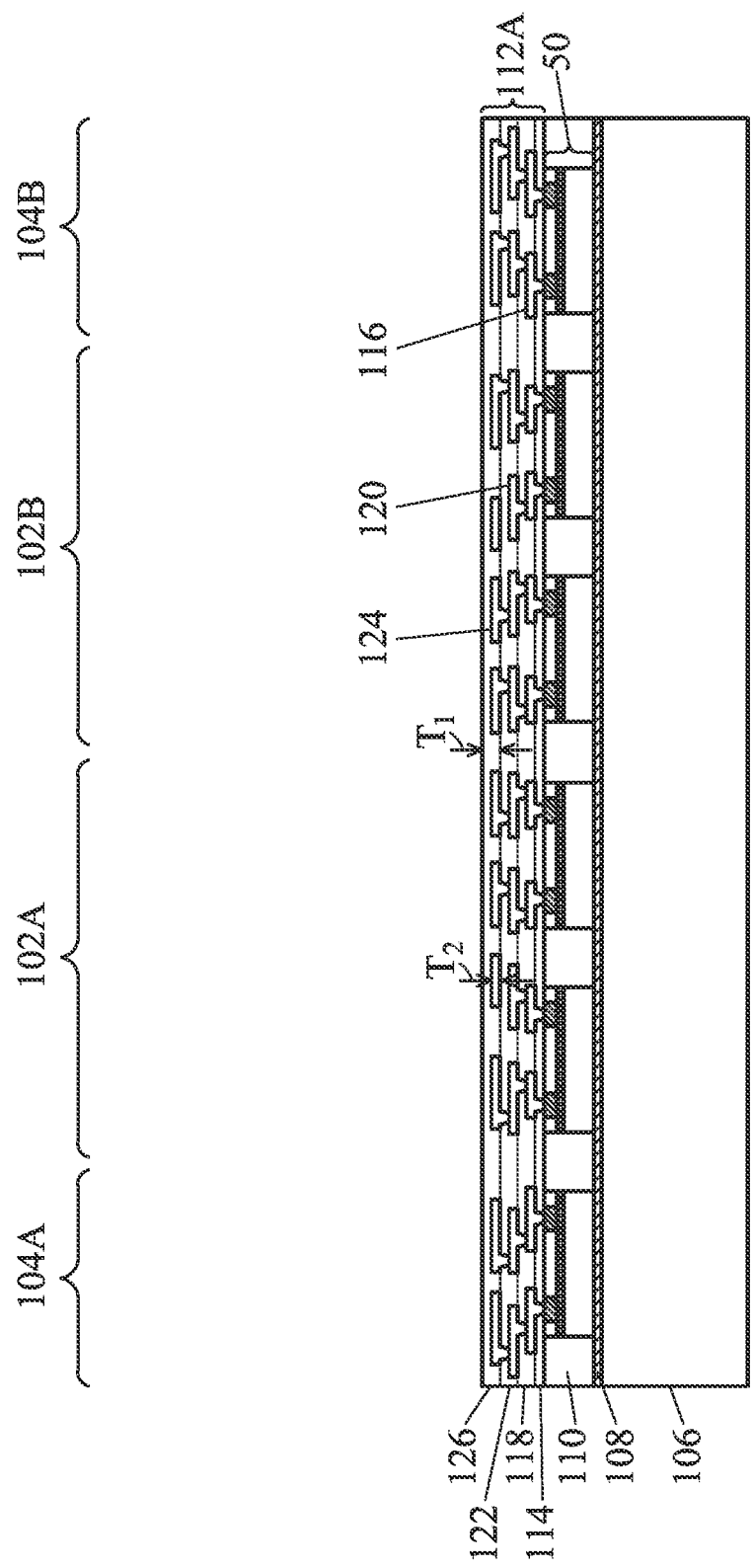
Figure 7:
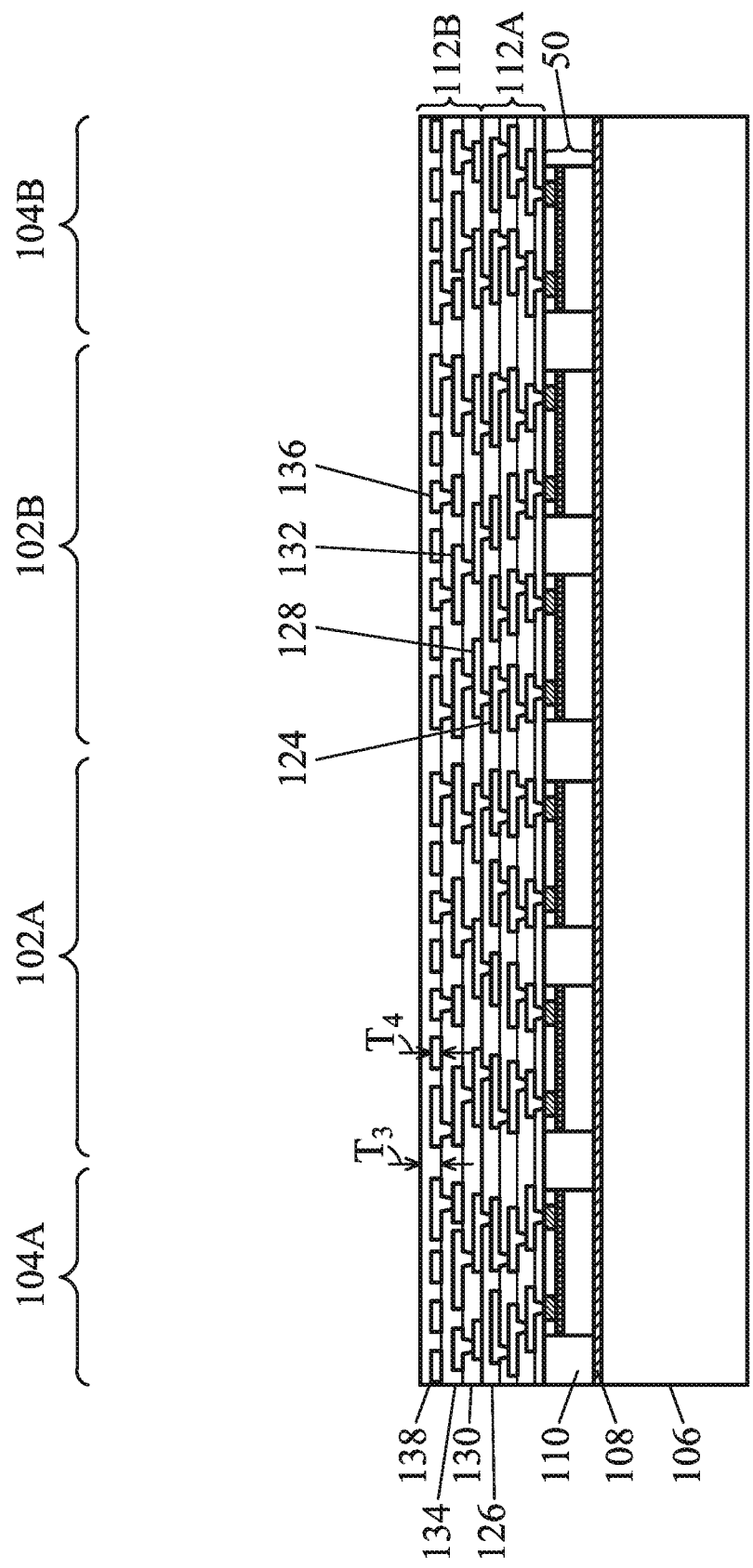
Figure 8:
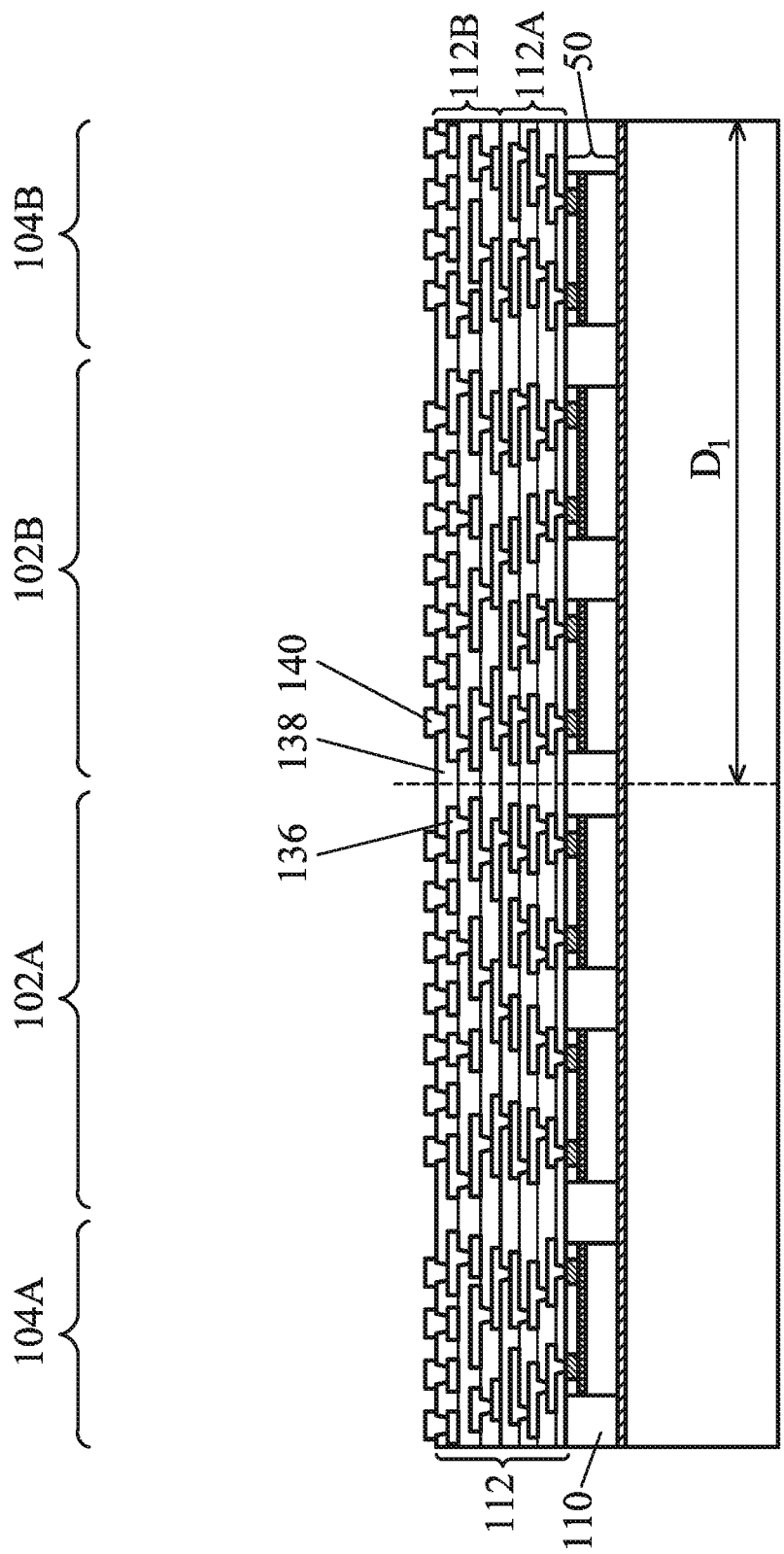

In FIGS. 6 through 8, a redistribution structure 112 (see FIG. 8) having a fine-featured portion 112A and a coarse-featured portion 112B is formed over the encapsulant 110 and integrated circuit dies 50, in accordance with some embodiments. The redistribution structure 112 includes metallization patterns, dielectric layers, and under-bump metallurgies (UBMs). The metallization patterns may also be referred to as redistribution layers or redistribution lines. The redistribution structure 112 is shown as an example having six layers of metallization patterns. More or fewer dielectric layers and metallization patterns may be formed in the redistribution structure 112. If fewer dielectric layers and metallization patterns are to be formed, steps and process discussed below may be omitted. If more dielectric layers and metallization patterns are to be formed, steps and processes discussed below may be repeated. The fine-featured portion 112A and coarse-featured portion 112B of the redistribution structure 112 include metallization patterns and dielectric layers of differing sizes.

The coarse-featured portion 112B may have lower resistance compared to the fine-featured portion 112A due to the thickness of the metallization patterns included in the coarse-featured portion 112B and the fine-featured portion 112A. In some embodiments, the coarse-featured portion 112B may be used to route power lines, which may function suitably while having a relatively high resistance. In some embodiments, the fine-featured portion 112A may be used to route signal lines, which may have improved function with a lower resistance. Including both the coarse-featured portion 112B and the fine-featured portion 112A allows for power lines and signal lines to be routed, while minimizing the thickness of the redistribution structure 112.

In FIG. 6, the fine-featured portion 112A of the redistribution structure 112 is formed, in accordance with some embodiments. The fine-featured portion 112A of the redistribution structure 112 includes dielectric layers 114, 118, 122, and 126; and metallization patterns 116, 120, and 124. In some embodiments, the dielectric layers 118, 122 and 126 are formed from a same dielectric material, and are formed to a same thickness. Likewise, in some embodiments, the conductive features of the metallization patterns 116, 120 and 124 are formed from a same conductive material, and are formed to a same thickness. In particular, the dielectric layers 118, 122 and 126 have a first thickness $T_1$ that is small, such as in the range of about 7 μm to about 50 μm, and the conductive features of the metallization patterns 116, 120 and 124 have a second thickness $T_2$ that is small, such as in the range of about 2 μm to about 20 μm.

As an example of forming the fine-featured portion 112A of the redistribution structure 112, the dielectric layer 114 is deposited on the encapsulant 110, dielectric layers 58, and die connectors 56. In some embodiments, the dielectric layer 114 is formed of a photo-sensitive material such as PBO, polyimide, BCB, or the like, which may be patterned using a lithography mask. The dielectric layer 114 may be formed by spin coating, lamination, CVD, the like, or a combination thereof. The dielectric layer 114 is then patterned. The patterning forms openings exposing portions of the die connectors 56. The patterning may be by an acceptable process, such as by exposing the dielectric layer 114 to light when the dielectric layer 114 is a photo-sensitive material or by etching using, for example, an anisotropic etch. If the dielectric layer 114 is a photo-sensitive material, the dielectric layer 114 can be developed after the exposure.

The metallization pattern 116 is then formed. The metallization pattern 116 has line portions (also referred to as conductive lines or traces) on and extending along the major surface of the dielectric layer 114, and has via portions (also referred to as conductive vias) extending through the dielectric layer 114 to physically and electrically couple the die connectors 56 of the integrated circuit dies 50. As an example to form the metallization pattern 116, a seed layer is formed over the dielectric layer 114 and in the openings extending through the dielectric layer 114. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 116. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 116. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 118 is then deposited on the metallization pattern 116 and dielectric layer 114. The dielectric layer 118 may be formed in a similar manner and of a similar material as the dielectric layer 114. The metallization pattern 120 is then formed. The metallization pattern 120 has line portions on and extending along the major surface of the dielectric layer 118, and has via portions extending through the dielectric layer 118 to physically and electrically couple the metallization pattern 116. The metallization pattern 120 may be formed in a similar manner and of a similar material as the metallization pattern 116.

The dielectric layer 122 is then deposited on the metallization pattern 120 and dielectric layer 118. The dielectric layer 122 may be formed in a similar manner and of a similar material as the dielectric layer 114. The metallization pattern 124 is then formed. The metallization pattern 124 has line portions on and extending along the major surface of the dielectric layer 122, and has via portions extending through the dielectric layer 122 to physically and electrically couple the metallization pattern 120. The metallization pattern 124 may be formed in a similar manner and of a similar material as the metallization pattern 116.

The dielectric layer 126 is deposited on the metallization pattern 124 and dielectric layer 122. The dielectric layer 126 may be formed in a similar manner and of a similar material as the dielectric layer 114.

In FIG. 7, the coarse-featured portion 112B of the redistribution structure 112 is formed, in accordance with some embodiments. The coarse-featured portion 112B of the redistribution structure 112 includes dielectric layers 130, 134, and 138; and metallization patterns 128, 132, and 136. In some embodiments, the dielectric layers 130, 134, and 138 are formed from a same dielectric material, and are formed to a same thickness. Likewise, in some embodiments, the conductive features of the metallization patterns 128, 132, and 136 are formed from a same conductive material, and are formed to a same thickness. In particular, the dielectric layers 130, 134, and 138 have a third thickness $T_3$ that is large, such as in the range of about 7 μm to about 50 μm, and the conductive features of the metallization patterns 128, 132, and 136 have a fourth thickness $T_4$ that is large, such as in the range of about 2 μm to about 20 μm. The third thickness $T_3$ is greater than the first thickness $T_1$ (see FIG. 6), and the fourth thickness $T_4$ is greater than the second thickness $T_2$ (see FIG. 6).

As an example of forming the coarse-featured portion 112B of the redistribution structure 112, the metallization pattern 128 is formed. The metallization pattern 128 has line portions on and extending along the major surface of the dielectric layer 126, and has via portions extending through the dielectric layer 126 to physically and electrically couple the metallization pattern 124. As an example to form the metallization pattern 128, a seed layer is formed over the dielectric layer 126 and in the openings extending through the dielectric layer 126. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 128. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 128. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 130 is then deposited on the metallization pattern 128 and dielectric layer 126. In some embodiments, the dielectric layer 130 is formed of a photo-sensitive material such as PBO, polyimide, BCB, or the like, which may be patterned using a lithography mask. The dielectric layer 130 may be formed by spin coating, lamination, CVD, the like, or a combination thereof. The metallization pattern 132 is then formed. The metallization pattern 132 has line portions on and extending along the major surface of the dielectric layer 130, and has via portions extending through the dielectric layer 130 to physically and electrically couple the metallization pattern 128.

The metallization pattern 132 may be formed in a similar manner and of a similar material as the metallization pattern 128.

The dielectric layer 134 is then deposited on the metallization pattern 132 and dielectric layer 130. The dielectric layer 134 may be formed in a similar manner and of a similar material as the dielectric layer 130. The metallization pattern 136 is then formed. The metallization pattern 136 has line portions on and extending along the major surface of the dielectric layer 134, and has via portions extending through the dielectric layer 134 to physically and electrically couple the metallization pattern 132. The metallization pattern 136 may be formed in a similar manner and of a similar material as the metallization pattern 128.

The dielectric layer 138 is deposited on the metallization pattern 136 and dielectric layer 134. The dielectric layer 138 may be formed in a similar manner and of a similar material as the dielectric layer 130.

In FIG. 8, UBMs 140 are formed for external connection to the redistribution structure 112. The UBMs 140 have bump portions on and extending along the major surface of the dielectric layer 138, and have via portions extending through the dielectric layer 138 to physically and electrically couple the metallization pattern 136. As a result, the UBMs 140 are electrically coupled to the integrated circuit dies 50. The UBMs 140 may be formed in a similar manner and of a similar material as the metallization pattern 136. In some embodiments, the UBMs 140 have a different size than the metallization patterns 116, 120, 124, 128, 132, and 136.

After formation, the outermost extent of the redistribution structure 112 extends a distance $D_1$ from the center of the package structure 100. As noted above, the package structure 100 is relatively large. The distance $D_1$ is thus also relatively large. For example, the distance $D_1$ can be in the range of about 50 mm to about 200 mm.

Figure 9:
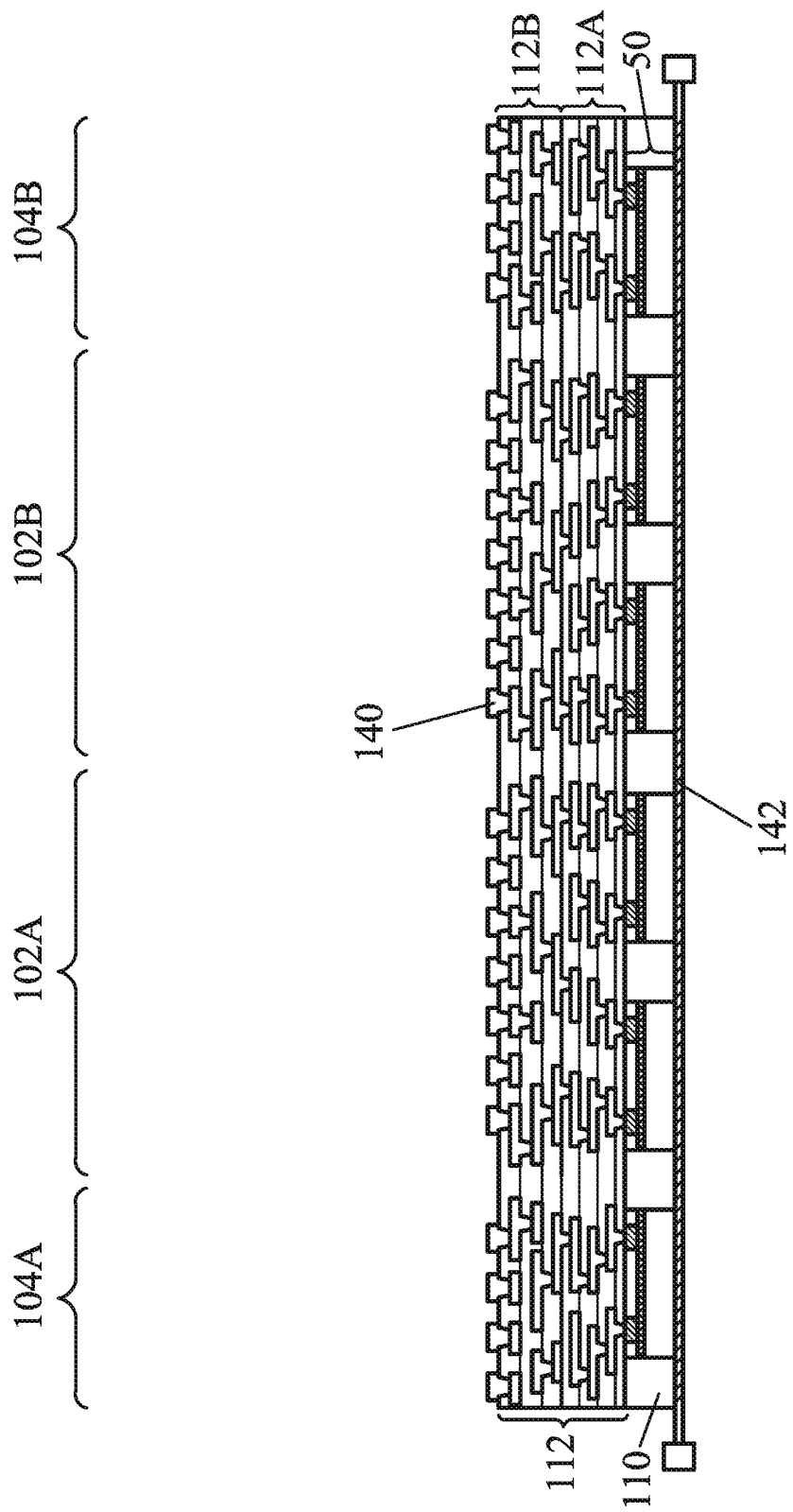

In FIG. 9, a carrier substrate debonding is performed to detach (or "debond") the carrier substrate 106 from the encapsulant 110 and integrated circuit dies 50. In some embodiments, the debonding includes removing the carrier substrate 106 and adhesive layer 108 by, e.g., a grinding or planarization process, such as a CMP process. After removal, back side surfaces of the integrated circuit dies 50 may be exposed, and the back side surfaces of the encapsulant 110 and integrated circuit dies 50 may be level. The structure is then placed on a tape 142.

Figure 10:
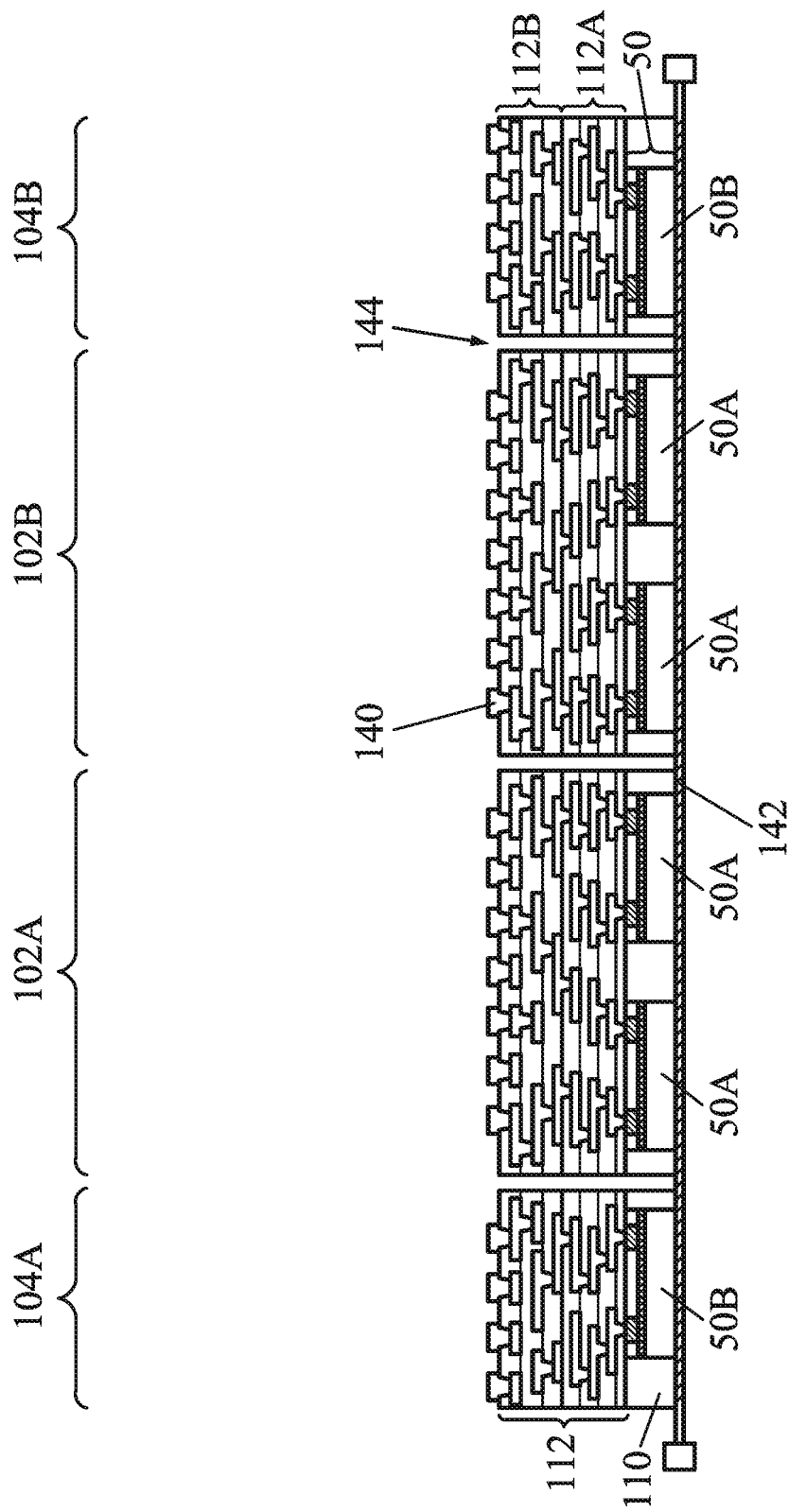

In FIG. 10, bolt holes 144 are formed through the package structure 100. The bolt holes 144 may be formed by a drilling process such as laser drilling, mechanical drilling, or the like. The bolt holes 144 may be formed by drilling an outline for the bolt holes 144 using a drilling process, and then removing the material separated by the outline, for example.

Figure 11:
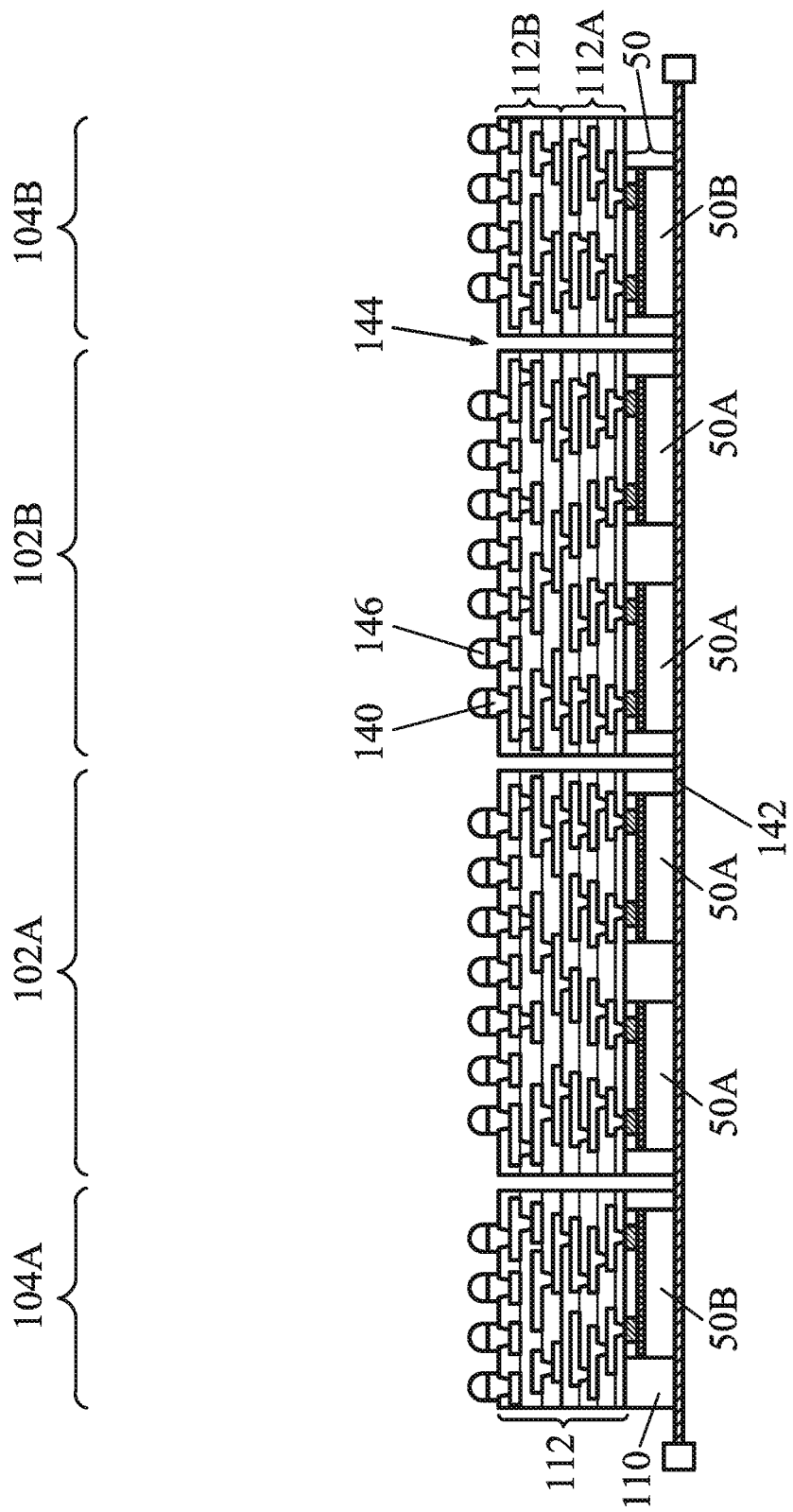

In FIG. 11, conductive connectors 146 are formed on the UBMs 140. The conductive connectors 146 may be ball grid array (BGA) connectors, solder balls, metal pillars, controlled collapse chip connection (C4) bumps, micro bumps, electroless nickel-electroless palladium-immersion gold technique (ENEPIG) formed bumps, electroless nickel-immersion gold technique (ENIG) formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder or solder paste through evaporation, electroplating, printing, solder transfer, ball placement, or the like. Once a layer of solder has been formed on the structure, a reflow may be performed in order to shape the material into the desired bump shapes.

Figure 12:
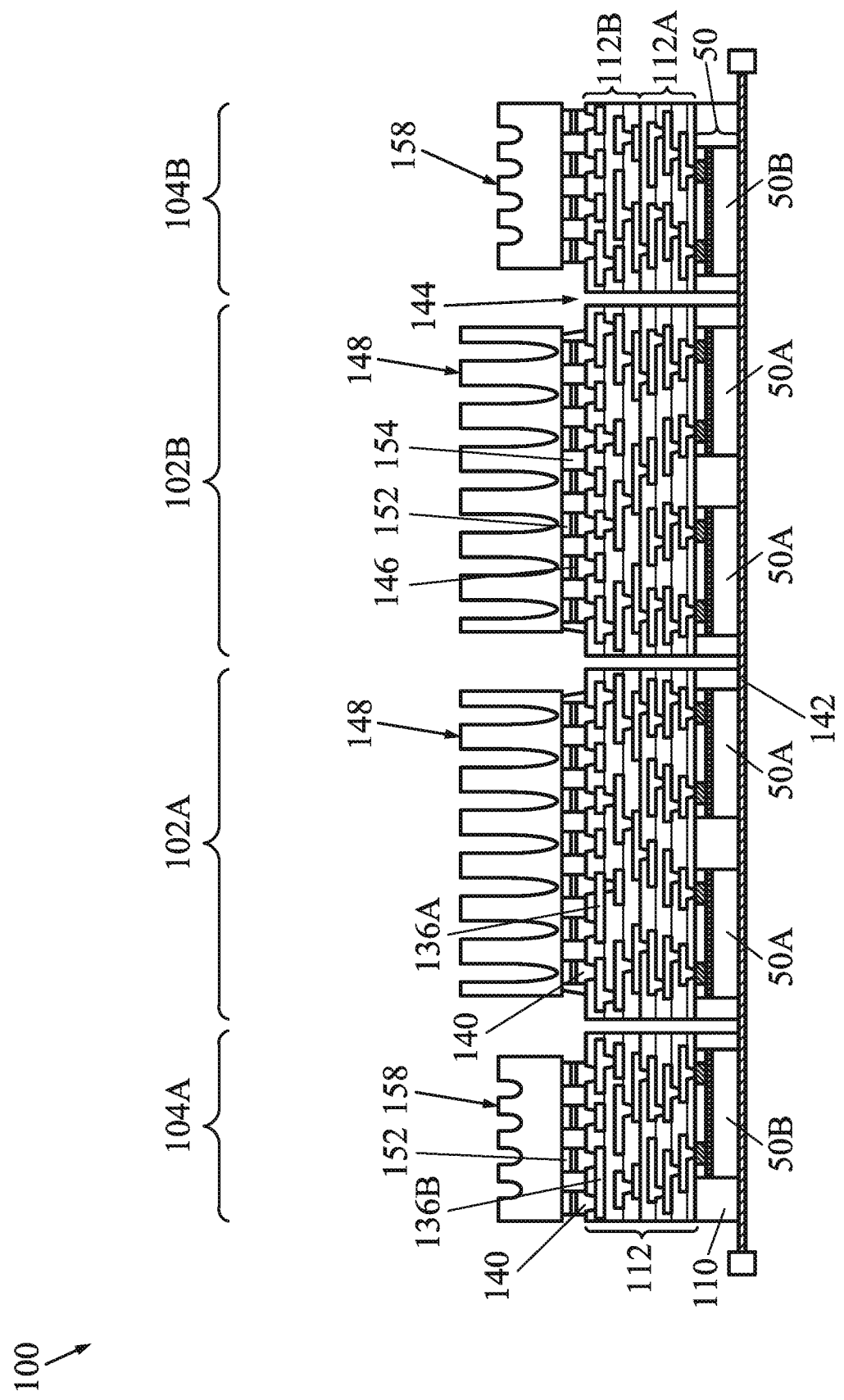

In FIG. 12, sockets 148 and connectors 158 are attached to the redistribution structure 112 to form the package structure 100, in accordance with some embodiments. The sockets 148 and connectors 158 are interfaces for external connection to the package structure 100. For example, the sockets 148 and connectors 158 may be used to perform system-level testing on the entire package structure 100, described in greater detail below. The sockets 148 and connectors 158 may include pads 152, such as aluminum pads, which are used for physical and electrical connection to the redistribution structure 112. Attaching the sockets 148 or connectors 158 may include placing the sockets 148 and connectors 158 on the redistribution structure 112 using, e.g., a pick-and-place technique, and then reflowing the conductive connectors 146 to physically and electrically couple the pads 152 to the UBMs 140. Reflow of the conductive connectors 146 may be performed such that the sockets 148 and connectors 158 are simultaneously attached to the redistribution structure 112. In the embodiment shown, the sockets 148 are attached at the computing sites 102A and 102B, and the connectors 158 are attached at the connecting sites 104A and 104B.

In some embodiments, two or more pads 152 of a socket 148 or a connector 158 may be electrically shorted by a metallization pattern within the redistribution structure 112. For example, in FIG. 12, the metallization pattern 136 of the redistribution structure 112 includes a conductive line 136A that electrically connects adjacent UBMs 140 used for a socket 148 and includes a conductive line 136B that electrically connects adjacent UBMs 140. In some embodiments, electrically shorting pads 152 in this manner may provide a "loopback path" that may be used during certain electrical tests, such as those described below in FIG. 23. In some embodiments, the pads 152 may be electrically shorted to provide redundancy or to provide improved connection quality for the electrical connections between the socket 148 or the connector 158 and the redistribution structure 112.

Still referring to FIG. 12, an underfill 154 may be formed to fill the gaps between the sockets 148 and the redistribution structure 112. The underfill 154 may be formed by a capillary flow process after the sockets 148 and connectors 158 are attached, or may be formed by a suitable deposition method before the sockets 148 and connectors 158 are attached. In some embodiments, an underfill 154 may also be formed under the connectors 158.

Figure 13:
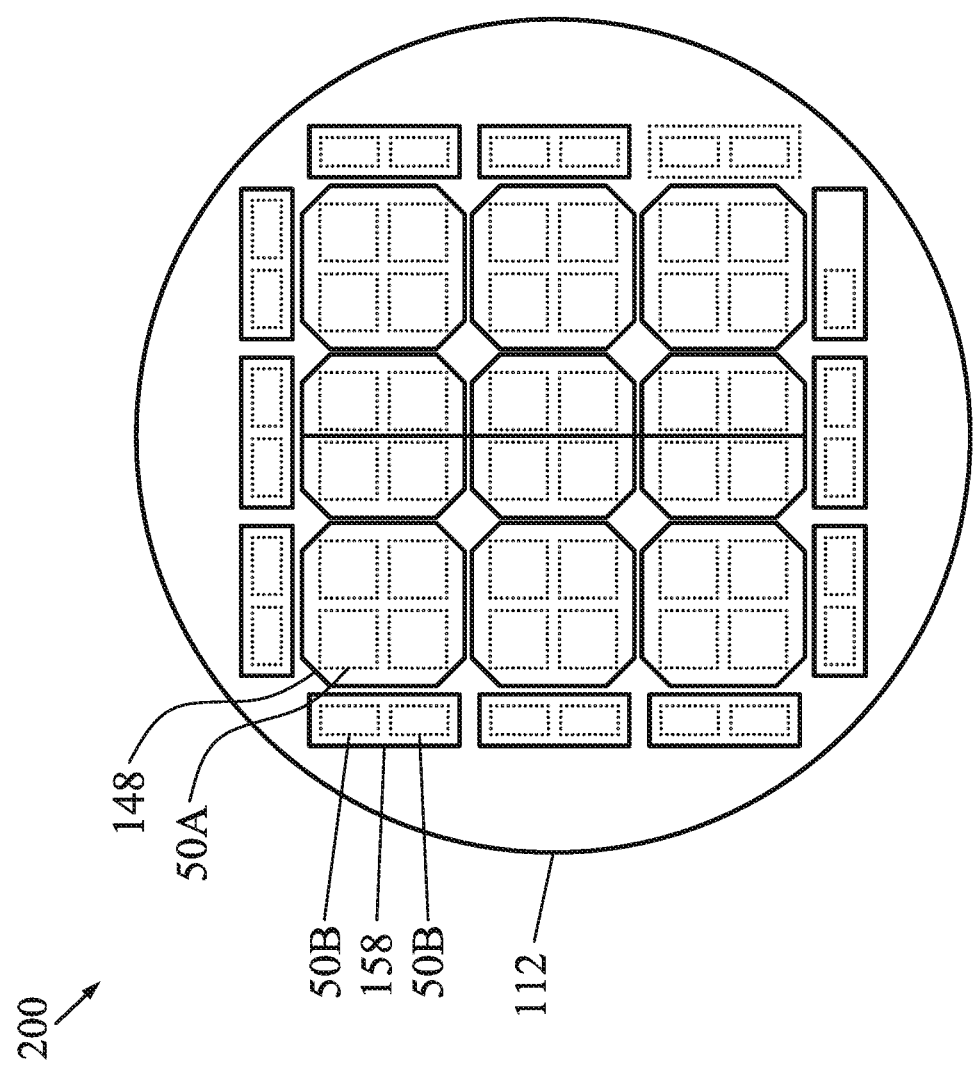
FIG. 13 illustrates a plan view of a package structure, in accordance with some embodiments.

Turning to FIG. 13, a plan view a package structure 100 is shown, in accordance with some embodiments. As shown in FIG. 13, multiple sockets 148 may be in an array-like configuration and may be surrounded by multiple connectors 158. Each socket 148 may cover multiple SoC dies 50A, and each connector 158 may cover multiple I/O interface dies 50B. The arrangement of sockets 148 and connectors 158 shown in FIG. 13 is an illustrative example, and more or fewer sockets 148 or connectors 158 may be present. The sockets 148 or connectors 158 may also have different sizes or shapes than shown. Other configurations, arrangements, or layouts are possible.

The sockets 148 are electrical and physical interfaces for modules or test substrates 222 (discussed below) that may be installed at the computing sites 102A and 102B subsequent to manufacture of the package structure 100. For example, a user of the package structure 100 may install modules in the sockets 148 to form completed functional systems at the computing sites 102A and 102B. The type of modules selected for installation depends on the type of functional systems desired at the computing sites 102A and 102B. Examples of modules that may be installed in the sockets 148 include memory modules, voltage regulator modules, power supply modules, integrated passive device (IPD) modules, and the like.

Figure 14B:
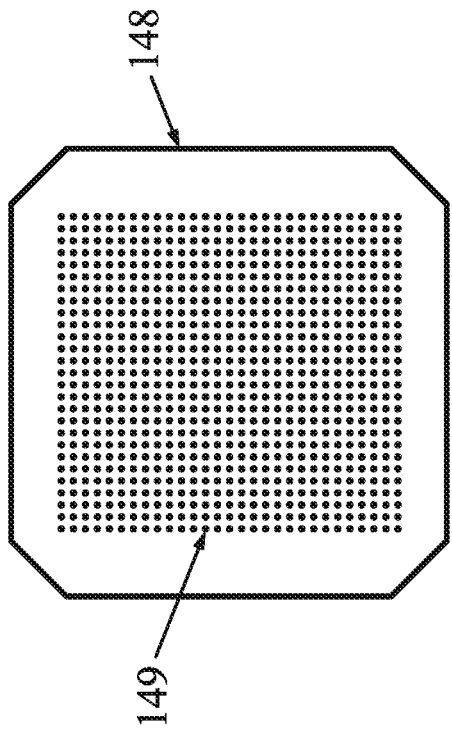
FIGS. 14A and 14B illustrate a cross-sectional view and a plan view of a socket of a package structure, in accordance with some embodiments.
Figure 14A:
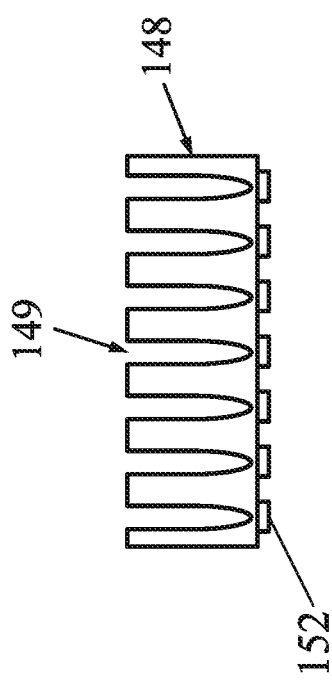

Referring to FIGS. 14A and 14B, a cross-sectional view and a plan view of a socket 148 is shown, in accordance with some embodiments. The socket 148 may include different components, such as a chassis, pads 152, and pin holes 149. In some embodiments, each pin hole 149 is associated with a respective pad 152 such that a pin inserted into a pin hole 149 may be electrically connected to a corresponding pad 152. The socket 148 shown in FIGS. 14A-B is an illustrative example, and sockets 148 may have a different size, shape, or configuration in other embodiments.

The connectors 158 are electrical and physical interfaces for additional external connectors such as test connectors 230 (discussed further below) to the connecting sites 104A and 104B. For example, a user of the package structure 100 may connect external connectors to the connectors 158 to communicate with the package structure 100 using electronic signals, or to perform electrical tests on the package structure 100 or components within.

Figure 15B:
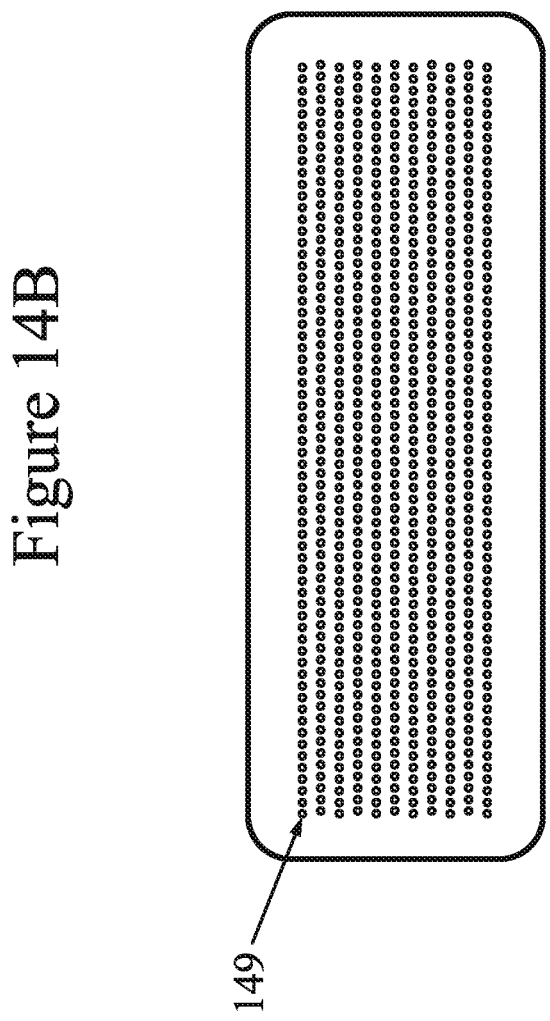
FIGS. 15A and 15B illustrate a cross-sectional view and a plan view of a connector of a package structure, in accordance with some embodiments.
Figure 15A:
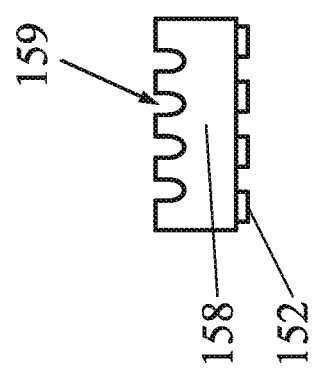

Referring to FIGS. 15A and 15B, a cross-sectional view and a plan view of a connector 158 is shown, in accordance with some embodiments. The connector 158 may include different components, such as a substrate, pads 152, and pin holes 159. In this manner, the connector 158 may be considered a "female connector." In other embodiments, the pads 152 may pins or similar conductive features. Connectors 158 may include a plurality of signal paths and may be used as a bus(es) for parallel or serial signal transmissions between the package structure 100 and other systems or components. The connector 158 shown in FIGS. 15A-B is an illustrative example, and connectors 158 may have a different size, shape, or configuration in other embodiments.

Figure 16:
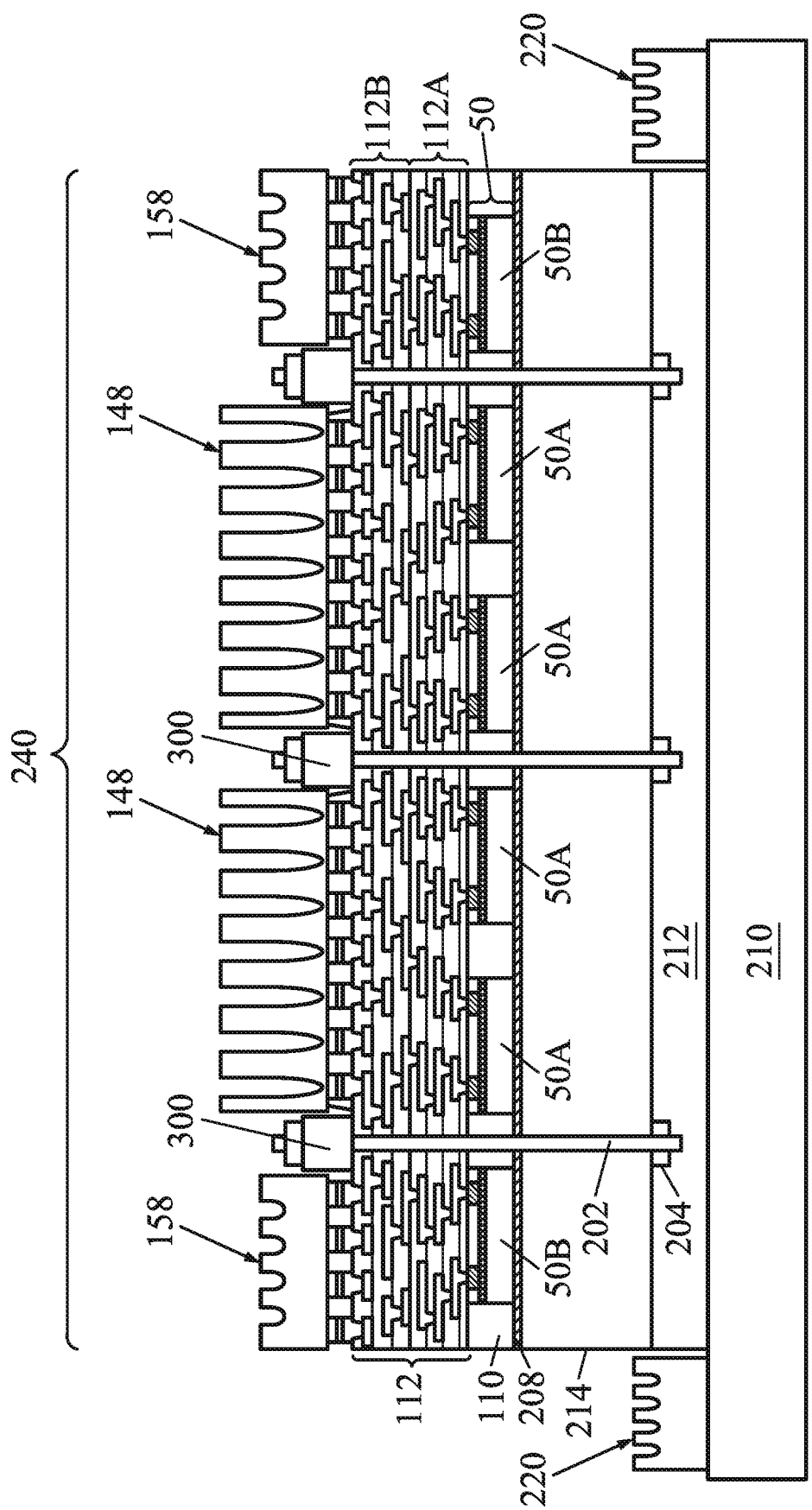
FIGS. 16 and 17 illustrate cross-sectional views of intermediate steps during a process for placing a package structure in a test system, in accordance with some embodiments.
Figure 17:
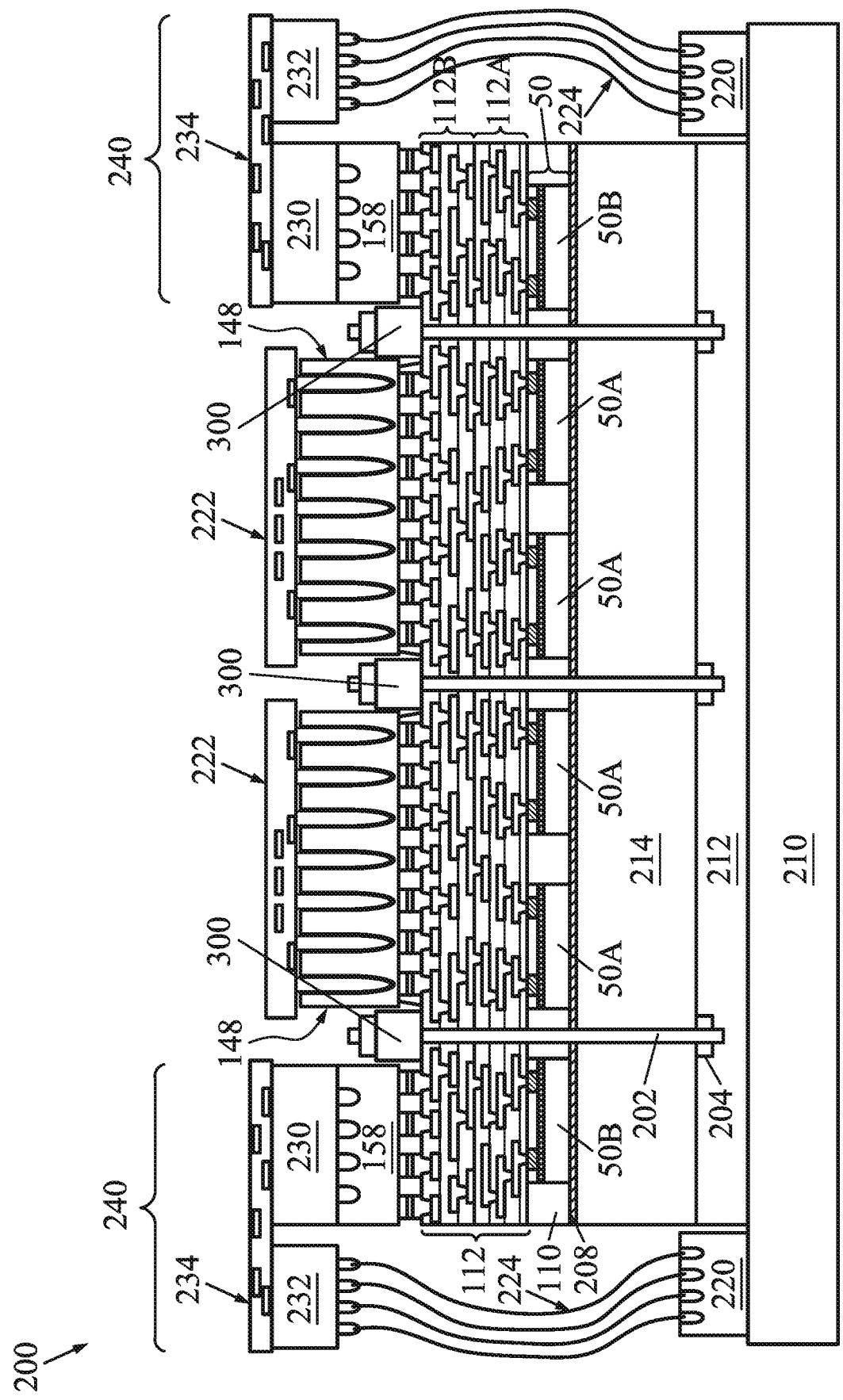

FIGS. 16 and 17 illustrate the placement of the package structure 100 in a test system 200, in accordance with some embodiments. The test system 200 is an assembly configured to perform system-level electrical tests on the package structure 100, described in greater detail below. For example, the test system 200 allows electrical tests to be performed on the package structure 100 after manufacture of the package structure 100 has been completed. In this manner, a completed package structure 100 can be tested, rather than testing components of the package structure 100 prior to completion. The test system 200 may be part of an automatic test equipment (ATE) tool. As shown in FIG. 16, the test system 200 may include a load board 210 to which the package structure 100 is secured. The load board 210 may be, for example, a substrate, circuit board, interface board, PCB, or the like that may contain suitable routing or circuitry configured to perform electrical tests on the package structure 100. The load board 210 may also include board connectors 220 or other types of electrical connectors. In some embodiments, the board connectors 220 are a similar type of connector as the connectors 158.

Still referring to FIG. 16, the package structure 100 may be placed in the test system 200 by securing the package structure 100 between a thermal module 214 and a mechanical brace 300, in some embodiments. The thermal module 214 may be, for example, a heat sink, a heat spreader, a cold plate, or the like. The thermal module 214 may be attached to the load board 210 by a buffer material 212. The buffer material 212 may be, for example a plastic, a foam, a porous material, or the like that thermally insulates the load board 210 and protects the load board 210 from the bolts 202 or fasteners 204, described below. In some embodiments, the buffer material 212 may have an area at least as large as that of the package structure 100. For example, the buffer material 212 may be a circle with a diameter of about 6 inches or greater, though other shapes or sizes are possible.

The mechanical brace 300 may be a rigid support that may be formed from a material with a high stiffness, such as a metal, e.g., steel, titanium, cobalt, or the like. The mechanical brace 300 physically engages portions of the redistribution structure 112 to secure the package structure 100. Warpage of the package structure 100, such as that induced by carrier substrate debonding, may be reduced by clamping the package structure 100 between the thermal module 214 and mechanical brace 300. In some embodiments, the mechanical brace 300 is a grid-shaped structure that has openings exposing portions of the sockets 148, e.g., for connecting modules or test substrates 222 to the sockets 148.

In some embodiments, the package structure 100 is removed from the tape 142 and is fastened between the thermal module 214 and the mechanical brace 300 using bolts 202. The bolts 202 are threaded through the bolt holes 144 of the package structure 100, through corresponding bolt holes in the thermal module 214, and through corresponding bolt holes in the mechanical brace 300. Fasteners 204 are threaded onto the bolts 202 and tightened to clamp the package structure 100 between the thermal module 214 and mechanical brace 300. The fasteners 204 may be, e.g., nuts that thread to the bolts 202 at opposite ends of each bolt 202. After being attached, portions of the mechanical brace 300 are disposed between the sockets 148, and between the sockets 148 and the connectors 158. As shown in FIG. 16, the bolts 202 may extend into the buffer material 212, and the fasteners 204 may be disposed partially or completely within the buffer material 212. In this manner, the load board 210 may be separated from the bolts 202 or fasteners 204 by the buffer material 212, which protects the load board 210 from e.g., scratches or damage from physical contact with the bolts 202 or fasteners 204.

Before placing the package structure 100, a thermal interface material (TIM) 208 may be dispensed on the back side of the package structure 100, physically and thermally coupling the thermal module 214 to the integrated circuit dies 50. The TIM 208 may be a film comprising indium, a HM03 type material, a thermal grease, a thermal sheet, a phase change material, the like, or a combination thereof. During fastening, the fasteners 204 are tightened, thereby increasing the mechanical force applied to the package structure 100 by the thermal module 214 and the mechanical brace 300. The fasteners 204 may be tightened until the thermal module 214 exerts a desired amount of pressure on the TIM 208.

FIG. 17 illustrates the test system 200 after test components are connected to the package structure 100, in accordance with some embodiments. The test components include test substrates 222 and test structures 240, in some embodiments. The test substrates 222 are connected to the sockets 148 and the test structures 240 are connected to the connectors 158 and to the board connectors 220. By connecting the test components to the package structure 100, electrical tests may be performed on the completed package structure 100. The test substrates 222 and the test structures 240 may be disconnected from the package structure 100 after electrical testing is completed.

In some embodiments, each test structure 240 comprises a circuit board 234 and multiple connectors, labeled as test connectors 230 and test connectors 232. The test connectors 230 and 232 make electrical connection between the test structure 240 and other components. In some embodiments, the test connectors 232 are disposed on the opposite side of the circuit board 234 as the test connectors 230. The circuit board 234 may be, for example, a substrate, circuit board, interface board, PCB, or the like that may contain suitable routing or circuitry configured to perform electrical tests and transmit electrical signals to the package structure 100 through the connectors 158.

As shown in FIG. 17, the test connectors 230 are configured to connect to the connectors 158 of the package structure 100 to make electrical connection between the circuit board 234 and the package structure 100. The test connectors 232 are connected to the board connectors 220 by wiring 224 to make electrical connection between the circuit board 234 and the load board 210. The wiring 224 may include a plurality of signal paths and may be used as a bus(es) for parallel or serial signal transmissions between the test structure 240 and the load board 210. The wiring 224 may include lengths of wire, cables, ribbon-type cables, the like, or a combination thereof. In this manner, electrical signals associated with electrical tests may be transmitted to and from the package structure 100 using the test structures 240.

Referring to FIGS. 18A and 18B, a cross-sectional view and a plan view of a test connector 230 is shown, in accordance with some embodiments. The test connector 230 may include different components, such as a substrate and pins 231. Each pin 231 is configured to be inserted within a corresponding pin hole 159 of the connector 158 to make electrical connection to that connector 158. In this manner, the test connector 230 may be considered a "male connector." Test connectors 230 may include a plurality of signal paths and may be used as a bus(es) for parallel or serial signal transmissions between the package structure 100 and the test structure 240. In some embodiments, the test connectors 230 are the same type of connector as the connectors 158, which type may be configured to connect as either a male connector or a female connector. The test connector 230 shown in FIGS. 18A-B is an illustrative example, and test connectors 230 may have a different size, shape, or configuration in other embodiments. The test connectors 232 may be similar to the test connectors 230 or may be a different type of connector.

Turning to FIGS. 19A and 19B, a cross-sectional view and a plan view of a test substrate 222 is shown, in accordance with some embodiments. The test substrate 222 may include different components, such as a substrate and pins 223. Each pin 223 is configured to be inserted within a corresponding pin hole 149 of the socket 148 to make electrical connection to that socket 148. The substrate may be, for example, a circuit board, interface board, PCB, or the like that may contain suitable routing or circuitry configured to perform electrical tests and transmit electrical signals between pins 223. For example, the substrate may contain routing that connects adjacent pins 223 throughout the test substrate 222. An example of routing that connects adjacent pins 223 is shown as routing 223A. In this manner, the pins 223 may be connected to form a "daisy-chain" or "loopback" electrical path for testing that passes through each connection between a socket 148 and the redistribution structure 112, described below for FIG. 23. The test substrate 222 may be another size, shape, or have a different configuration or routing layout in other embodiments.

Figure 20:
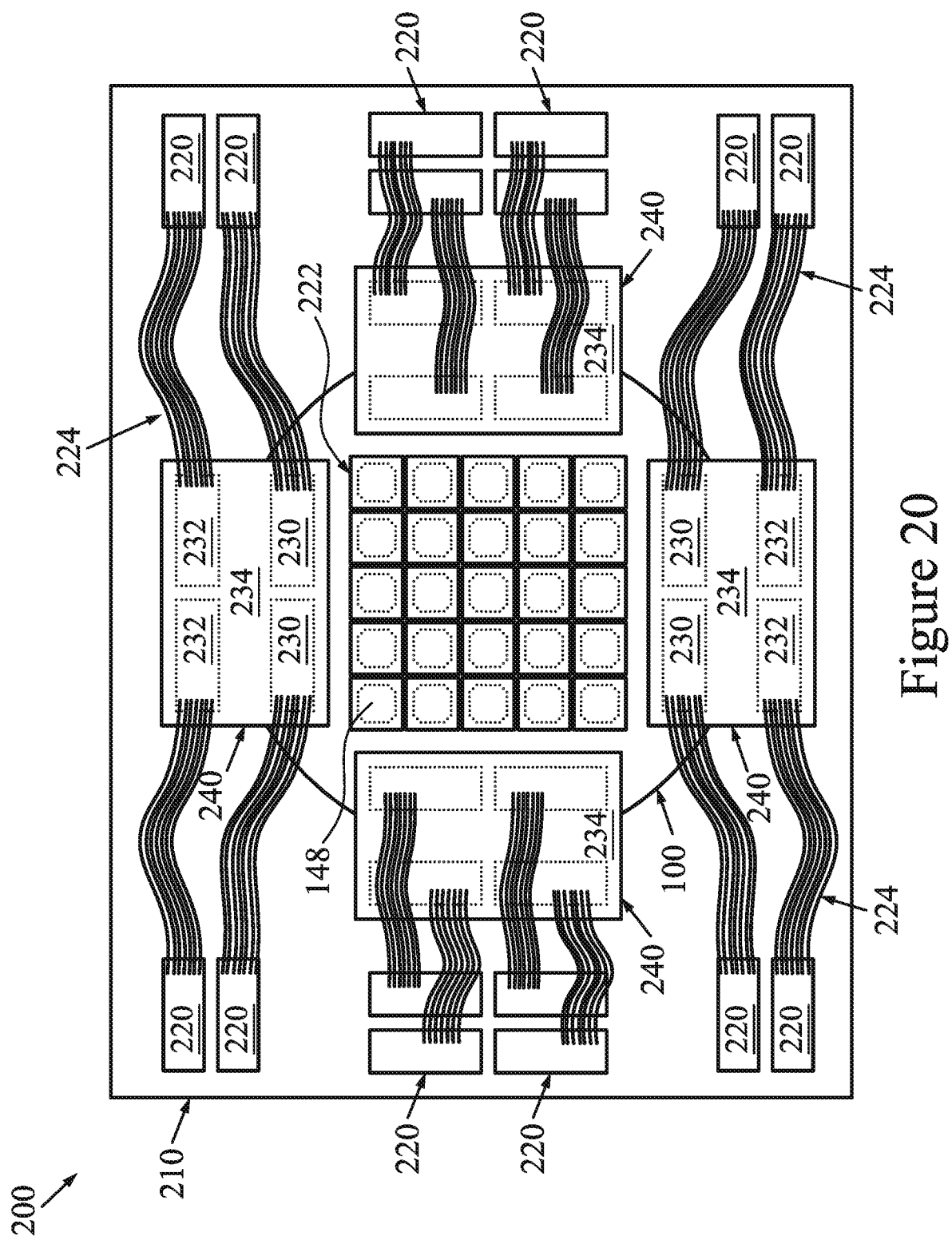
FIG. 20 illustrates a plan view of a package structure placed in a test system, in accordance with some embodiments.

Turning to FIG. 20, a plan view a package structure 100 placed in a test system 200 is shown, in accordance with some embodiments. As shown in FIG. 20, each socket 148 has a corresponding test substrate 222. A test structure 240 may be connected to multiple connectors 158 by multiple test connectors 230. A test structure 240 may also have multiple test connectors 232 that are connected to multiple board connectors 220 by appropriate wiring 224. The arrangement of test components, various connectors, wiring, and the like shown in FIG. 20 is an illustrative example. More or fewer test components and the like may be present and may be configured or connected differently than shown. The test components may also have different sizes or shapes than shown. Other configurations, arrangements, or layouts are possible.

Figure 21:
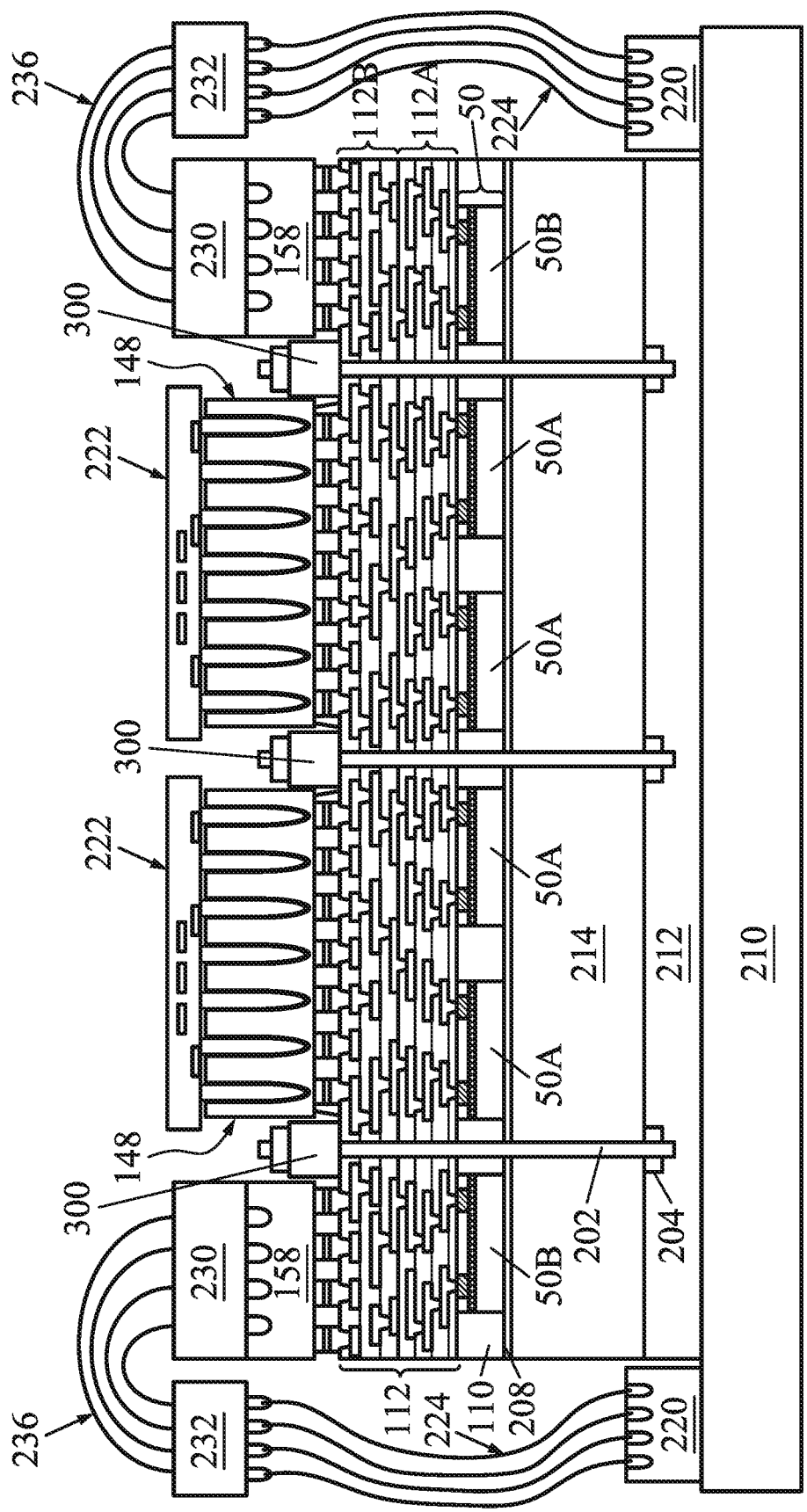
FIG. 21 illustrates a cross-sectional view of a package structure placed in a test system, in accordance with some embodiments.

Turning to FIG. 21, a test system 250 is shown, in accordance with some embodiments. Test system 250 is similar to test system 200 shown in FIG. 17, except that the test connectors 230 are connected to the test connectors 232 by wiring 236 instead of by a circuit board 234. The wiring 236 may include lengths of wire, cables, ribbon-type cables, the like, or a combination thereof. In some embodiments, the wiring 236 is connected directly to the wiring 224 without using a test connector 232. In some embodiments, a test system may include test connectors 230 connected to test connectors 232 by wiring 236 and test connectors 230 connected to test connectors 232 by circuit boards 234. The use of wiring 236 may allow for more flexibility of design of a test system or more flexibility of test component layout.

FIGS. 22 through 25 show example electrical paths for system-level electrical testing of the package structure 100 using a test system 200, in accordance with some embodiments. FIGS. 22-25 show a test system 200 that is similar to the test system 200 shown in FIG. 17, except that some details have been omitted for clarity. FIGS. 22-25 show illustrative examples of electrical paths for electrical tests, including electrical paths 310, 320, 330, and 340. The electrical paths may be, for example, continuous current paths from one test structure 240, through the package structure 100, and to another test structure 240. The electrical paths may be used, for example, to test the quality of connections within the package structure 100 or to verify continuity of connections within the package structure 100. The connections may include connections between connectors 158 and the redistribution structure 112, connections between sockets 148 and the redistribution structure 112, or connections between integrated circuit dies 50 and the redistribution structure 112. The tests may also test routing within the redistribution structure 112 or within the integrated circuit dies 50. For example, the tests may check for excess resistance of connections between connectors 158 or sockets 148 and the redistribution structure 112, or for connections that are defective. For example, the tests may be able to identify the presence of a defective conductive connector 146 that causes an open connection. Other tests are possible.

The electrical paths shown in FIGS. 22 through 25 include connector continuity paths 310, a socket continuity path 320, a single-die continuity path 330, and a cross-die continuity path 340. The electrical paths 310, 320, 330, and 340 are representative, and other electrical tests using variations of these paths, portions of these paths, similar paths, other paths, or combinations thereof may be used in other embodiments. For example, a single electrical path may be used to test the same electrical properties or the same conductive features as two separate electrical paths. The use of the test system 200 as described herein allow for these and other tests to be performed on a completed package structure 100. For example, the test system 200 may test for the presence of a defective connection over a large region of the package structure 100 or over the whole package structure 100. In this manner, the efficiency and ease of testing a large structure such as the package structure 100, another system-on-wafer structure, or the like may be improved.

Figure 22:
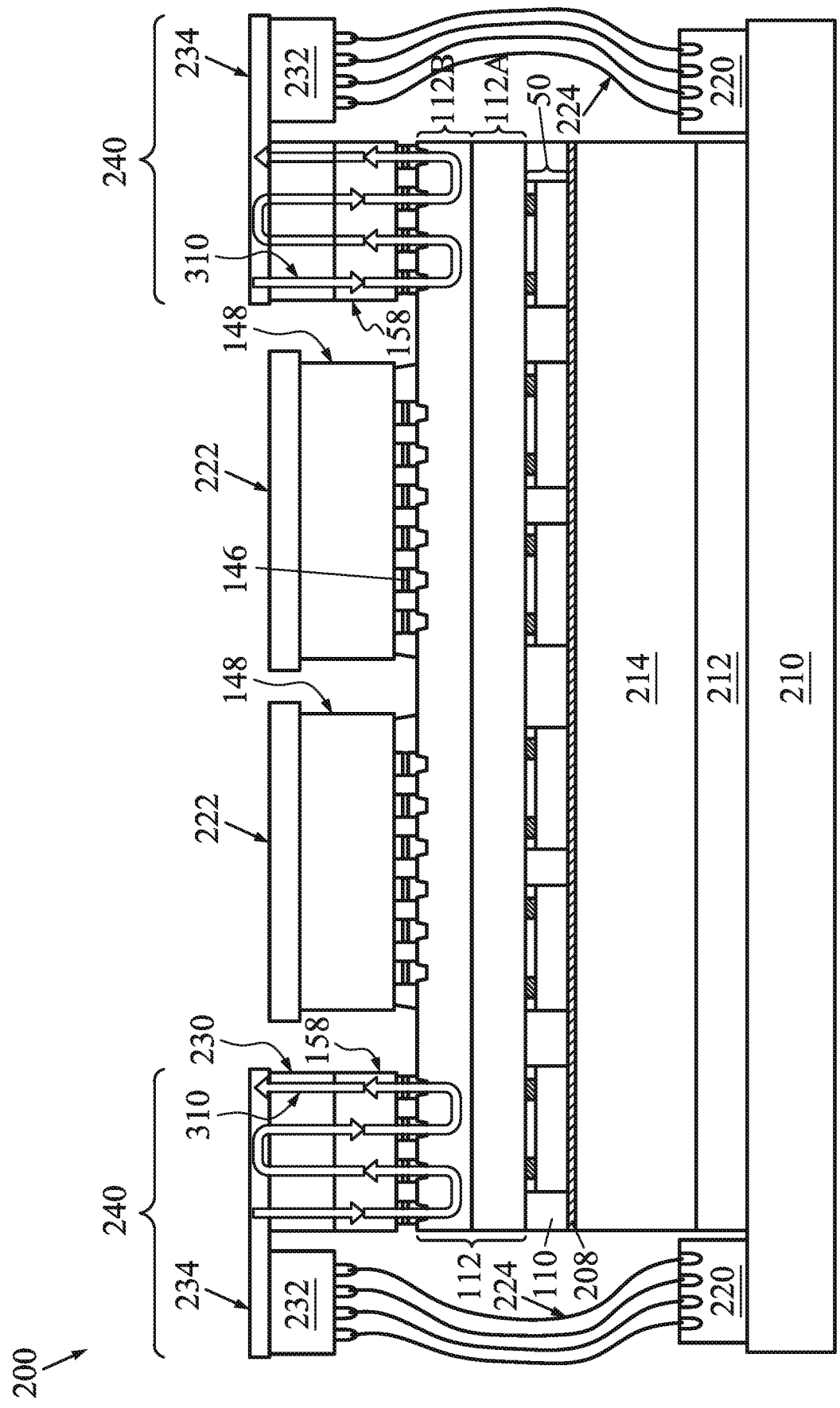
FIGS. 22 through 25 illustrate example electrical paths used by a test system to test a package structure, in accordance with some embodiments.

FIG. 22 shows connector continuity paths 310, in accordance with some embodiments. The paths 310 includes one or more loopback current paths from a test structure 240, through the redistribution structure 112, and back to the same test structure 240. The paths 310 may be used to test the quality of the connections between the connectors 158 and the redistribution structure 112, for example. As shown, a path 310 includes a chain of conductive features that passes through the connections between a connector 158 and the redistribution structure 112. A path 310 may test for a defective conductive connector 146, for example, though other electrical conditions may also be tested or measured.

Figure 23:
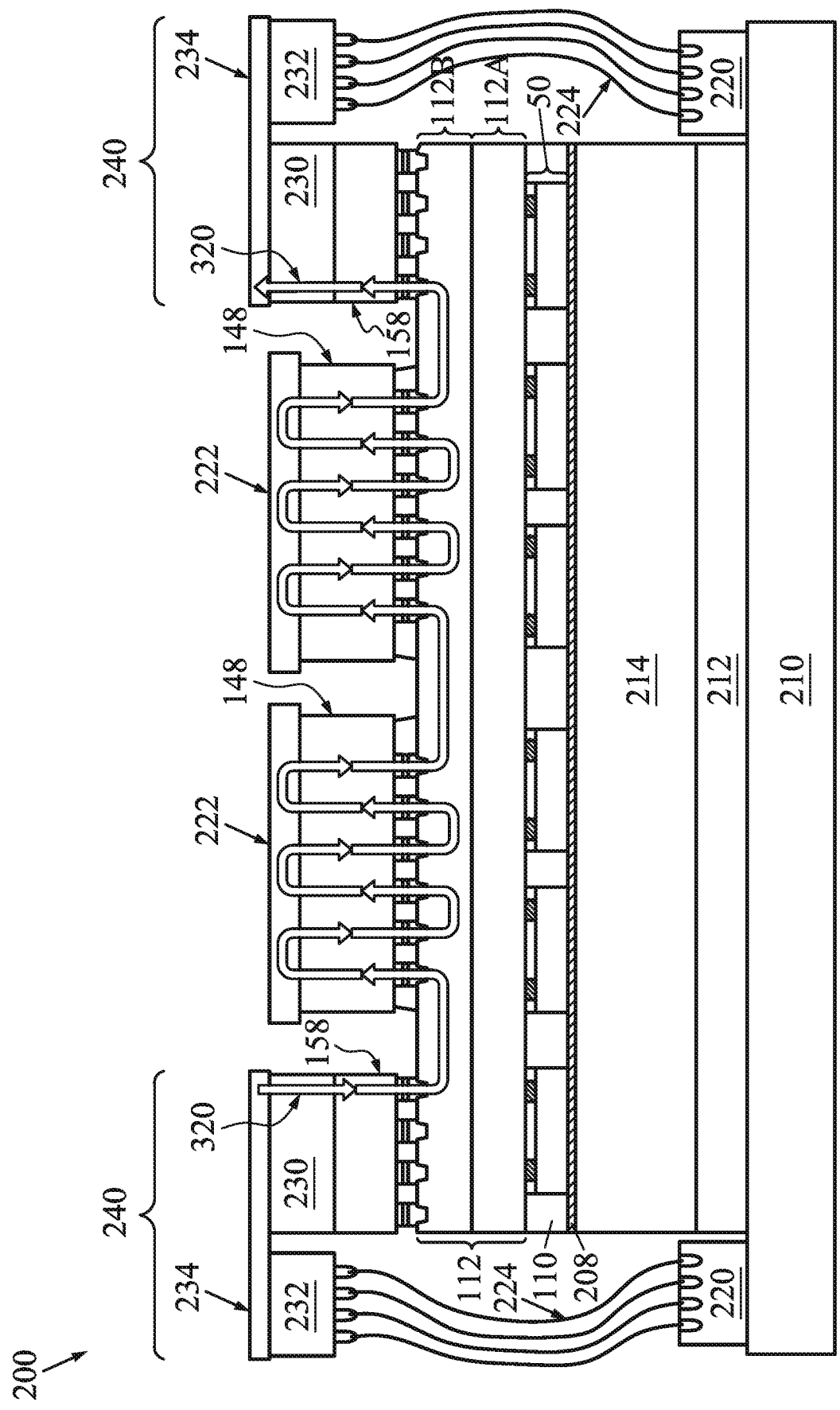

FIG. 23 shows a socket continuity path 320, in accordance with some embodiments. The path 320 includes a current path from a test structure 240, through the redistribution structure 112, through one or more sockets 148 and test substrates 222, and to a different test structure 240. The path 320 may also return to the same test structure 240, in some cases. The path 320 may be used to test the quality of the connections between the sockets 148 and the redistribution structure 112, for example. As shown, a path 320 includes a chain of conductive features that passes through the connections between a socket 148 and the redistribution structure 112, using the routing within the associated test substrate 222. In this manner, the path 320 may be a continuous conductive path having multiple conductive path segments that extend serially between each test substrate 222 and its corresponding socket 148. A path 320 may test for a defective conductive connector 146, for example, though other electrical conditions may also be tested or measured. In some cases, the test system 200 may test the connections of all sockets 148 of a package structure 100 using a path 320 in a single measurement.

Figure 24:
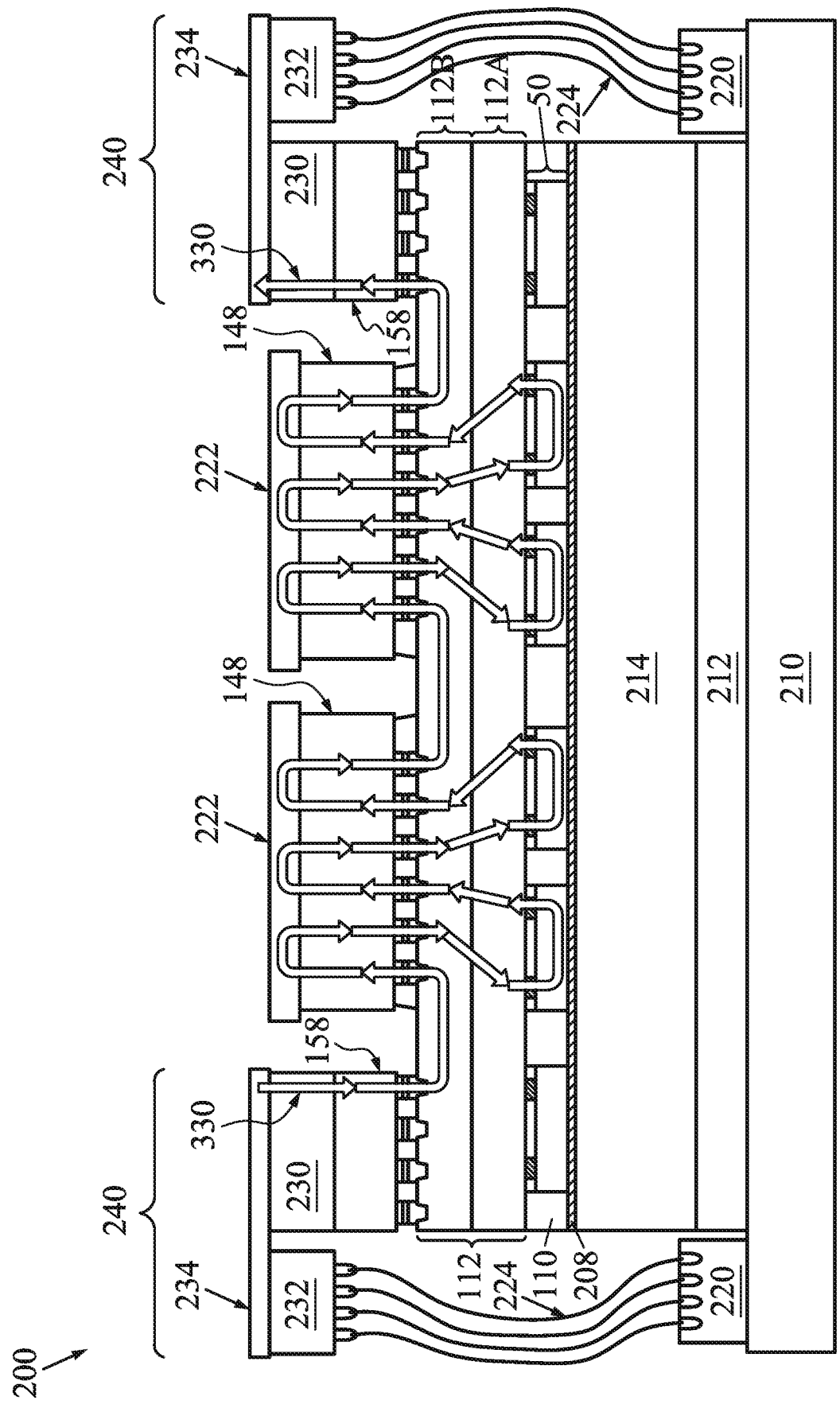

FIG. 24 shows a single-die continuity path 330, in accordance with some embodiments. The path 330 includes a current path from a test structure 240, through the redistribution structure 112, through one or more integrated circuit dies 50, through one or more sockets 148 and test substrates 222, and to a different test structure 240. The path 330 may also return to the same test structure 240, in some cases. The path 330 may be used to test the quality of the connections between one or more integrated circuit dies 50 and the redistribution structure 112, for example. The path 330 may also test for other electrical or operational characteristics of one or more integrated circuit dies 50. As shown, a path 330 includes a chain of conductive features that passes through the connections between integrated circuit dies 50 and the redistribution structure 112, using sockets 148 and the routing within the associated test substrate 222. In some cases, the test system 200 may test a single integrated circuit die 50, multiple integrated circuit dies 50, or all integrated circuit dies 50 of a package structure 100 using a path 330 in a single measurement.

Figure 25:
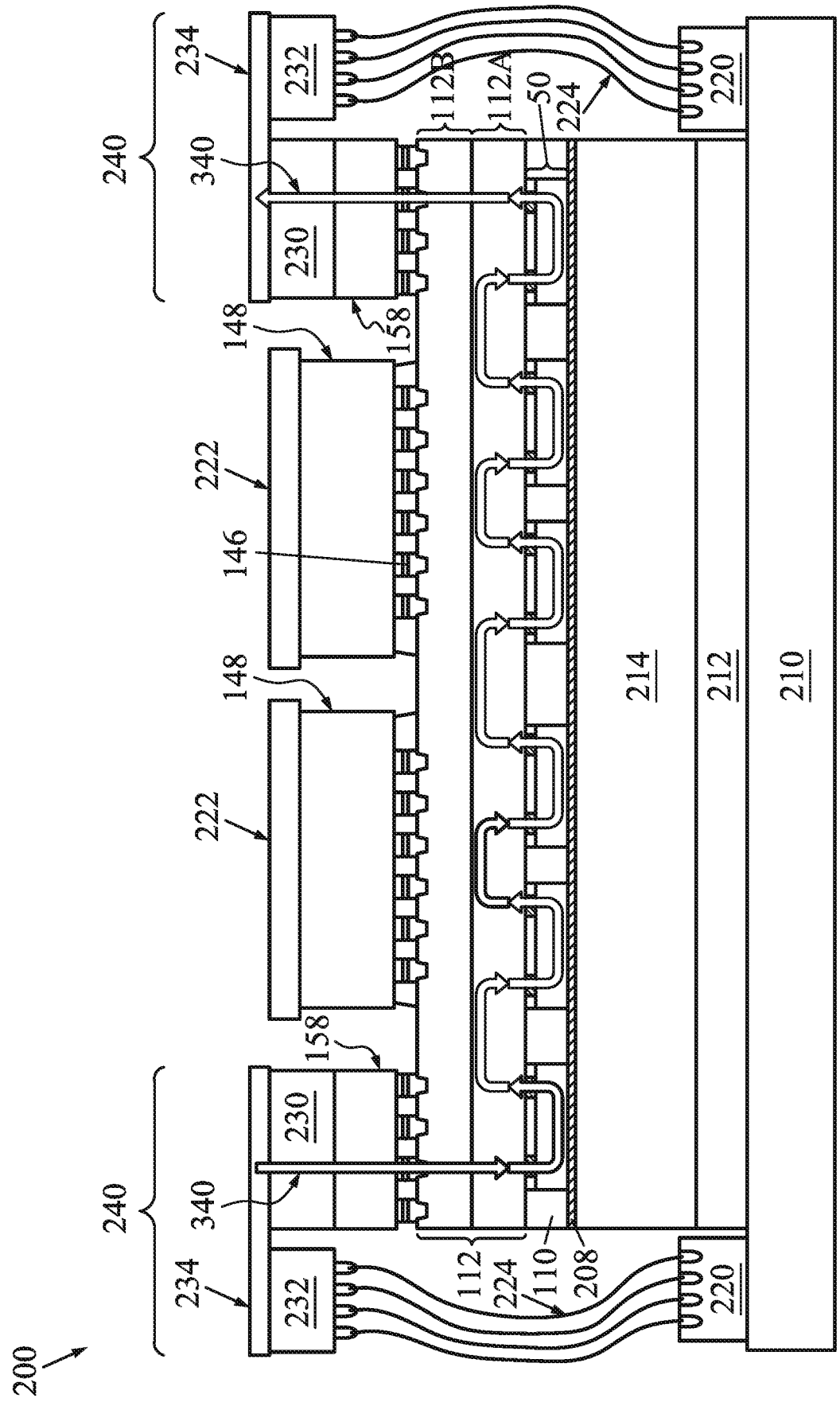

FIG. 25 shows a cross-die continuity path 340, in accordance with some embodiments. The path 340 includes a current path from a test structure 240, through the redistribution structure 112 and through two or more integrated circuit dies 50, and to a different test structure 240. The path 340 may also return to the same test structure 240, in some cases. The path 340 may be used to test the quality of the routing through the redistribution structure 112 between two or more integrated circuit dies 50, for example. The path 340 may also test for other electrical or operational characteristics of two or more integrated circuit dies 50. As shown, a path 340 includes a chain of conductive features (e.g., metallization patterns of the redistribution structure 112) that passes through two or more integrated circuit dies 50. In some cases, the test system 200 may test routing between all integrated circuit dies 50 of a package structure 100 using a path 340 in a single measurement.

Figure 26A:
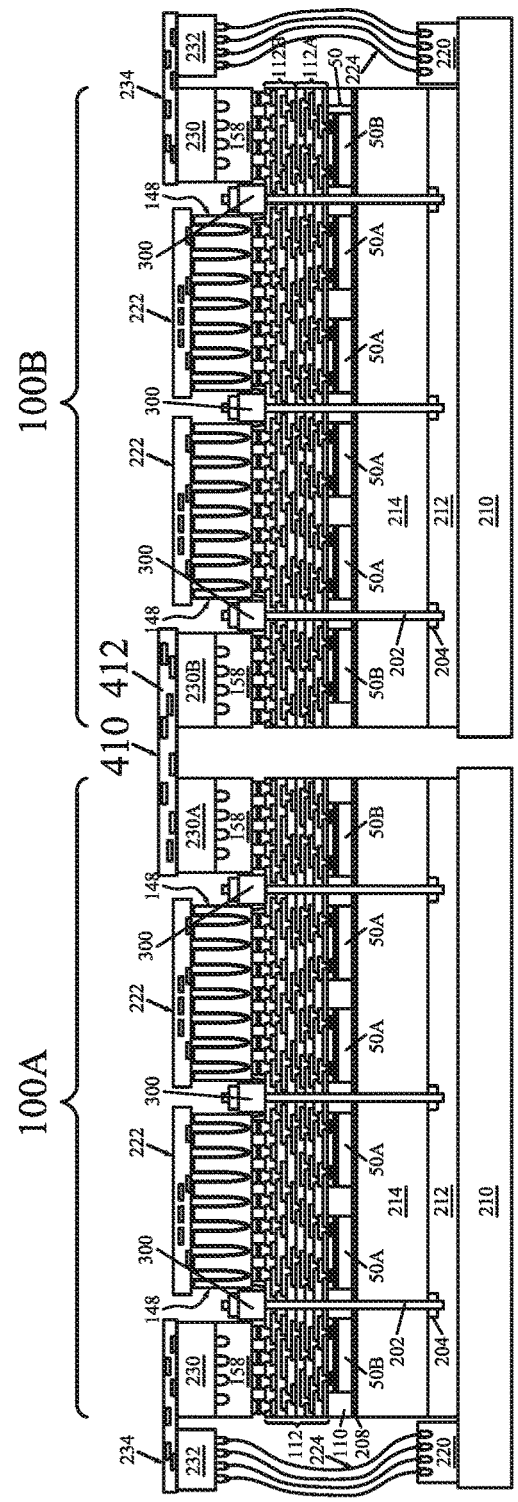
FIGS. 26A and 26B illustrate cross-sectional views of test systems incorporating multiple package structures, in accordance with some embodiments.
Figure 26B:
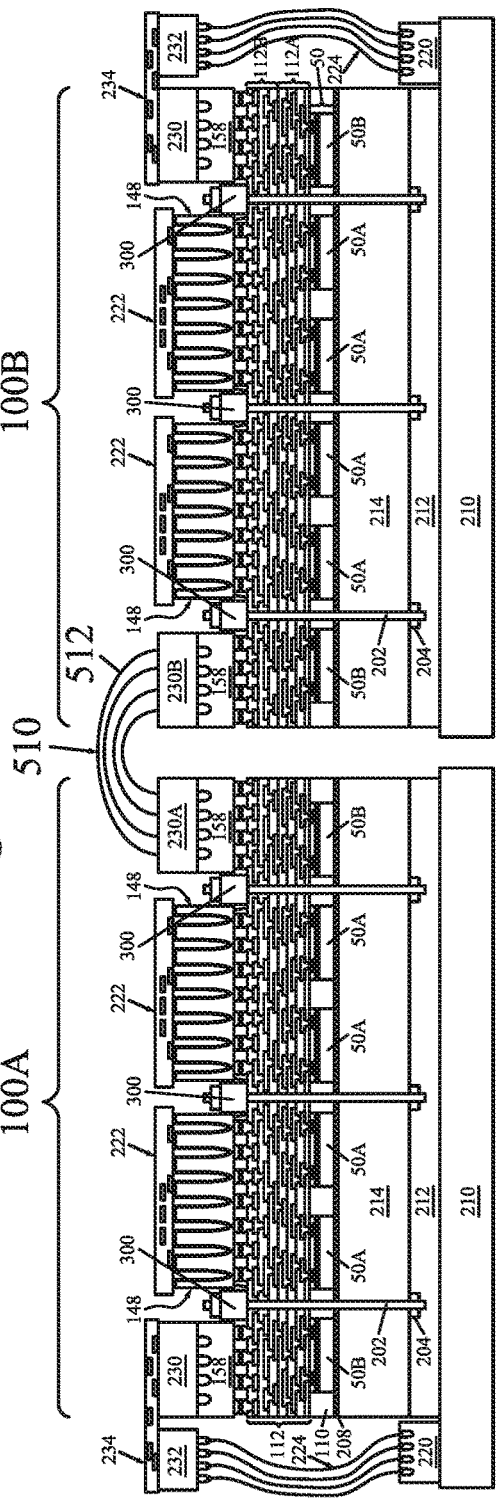

FIGS. 26A and 26B show test systems incorporating multiple package structures 100, in accordance with some embodiments. FIGS. 26A-B show test systems 400 and 500 that may be used to test communications in systems that include multiple package structures. For example, FIGS. 26A-B show systems that include two package structures connected together, labeled as a first package structure 100A and a second package structure 100B. The connected package structures 100A-B in FIGS. 26A-B are shown as similar package structures, but a system may include different types of package structures in other embodiments. In some embodiments, more than two package structures may be connected and tested using a similar test system as described for FIGS. 26A-B.

In FIG. 26A, the test system 400 includes a test structure 410 that includes a circuit board 412, a first test connector 230A and a second test connector 230B. The first test connector 230A is connected to the first package structure 100A, and the second test connector 230B is connected to the second package structure 100B. The circuit board 412 may be, for example, a substrate, an interface board, PCB, or the like that may contain suitable routing or circuitry configured to perform electrical tests and transmit electrical signals between the first package structure 100A and the second package structure 100B. In some embodiments, electrical paths that extend from the first package structure 100A, through the test structure 410, and to the second package structure 100B may be used to perform electrical tests. In this manner, multiple package structures and the connections between them may be tested using fewer electrical tests. Other electrical conditions may also be tested using the test system 400, such as testing the communications between package structures.

In FIG. 26B, the test system 500 includes a test structure 510 that includes a wiring 512 that connects a first test connector 230A to a second test connector 230B. The first test connector 230A is connected to the first package structure 100A, and the second test connector 230B is connected to the second package structure 100B. The wiring 512 may include lengths of wire, cables, ribbon-type cables, the like, or a combination thereof that is configured to perform electrical tests and transmit electrical signals between the first package structure 100A and the second package structure 100B. In some embodiments, electrical paths that extend from the first package structure 100A, through the wiring 512, and to the second package structure 100B may be used to perform electrical tests. In this manner, multiple package structures and the connections between them may be tested using fewer electrical tests. Other electrical conditions may also be tested using the test system 500, such as testing the communications between package structures.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments described herein may achieve advantages. For example, the test system described herein allows for system-scale electrical testing (e.g., "wafer-scale testing") of a large device such as a system-on-wafer (SoW) or the like. This allows the entire device to be tested after the device has been fully processed or almost fully processed. For example, the test system described herein allows for various connector continuity tests to be performed over the entire device or over regions of the device. This can improve testing efficiency and allow for improved yield analysis. The testing may include, for example, testing the connections of connectors, sockets, dies, or combinations or collections thereof.

In accordance with an embodiment of the present disclosure, a testing system includes a load board that includes a first circuit board, a first external connector attached to the first circuit board, and a thermal module attached to the first circuit board, wherein the thermal module is configured to hold a system-on-wafer structure including a connector and a socket, a connector structure including a second circuit board, wherein the second circuit board is electrically connected to the first external connector, and a second external connector configured to connect to the connector of the system-on-wafer structure, and a test structure configured to connect to the socket of the system-on-wafer structure, the test structure including a third circuit board and pins extending from the third circuit board, wherein adjacent pairs of pins of the test structure are electrically coupled through the third circuit board to form a continuous conductive path extending alternately between the system-on-wafer structure and the adjacent pairs of pins of the test structure. In an embodiment, the connector structure is configured to form a continuous conductive path extending alternately between the system-on-wafer structure and the connector structure. In an embodiment, the testing system includes a thermal foam between the thermal module and the first circuit board. In an embodiment, the system-on-wafer structure is secured to the thermal module by bolts, wherein the bolts extend into the thermal foam. In an embodiment, the second circuit board is electrically connected to the first external connector by wiring. In an embodiment, the connector structure is configured to transmit electrical testing signals between the first circuit board and the system-on-wafer structure. In an embodiment, the second external connector includes the same type of connector as the connector of the system-on-wafer structure. In an embodiment, the connector structure includes a third external connector, wherein the second circuit board is electrically connected to the first external connector through the third external connector.

In accordance with an embodiment of the present disclosure, a method includes securing a device to a load board, performing an electrical test process on the device, including connecting first test connectors to external connectors of the device, wherein the first test connectors electrically couple the device to the load board, connecting second test connectors to sockets of the device to form conductive paths, wherein each conductive path is a continuous conductive path through one of the second test connectors and a corresponding socket, wherein each conductive path includes a plurality of path segments connected in a series, each path segment extending between the second test connector and the corresponding socket, and sending an electrical signal from the load board to the device, and after performing the electrical test, removing the first test connectors from the external connectors, removing the second test connectors from the sockets, and removing the device from the load board. In an embodiment, securing the device to the load board includes securing the device to a cold plate attached to the load board. In an embodiment, sending the electrical signal includes sending the electrical signal along at least one conductive path. In an embodiment, the electrical test process includes an electrical continuity test through the conductive paths. In an embodiment, the conductive paths are connected in a series. In an embodiment, wherein, after connecting the second test connectors to the sockets, the second test connectors are electrically connected through the device. In an embodiment, connecting the second test connectors to the sockets includes inserting pins of each second test connector into the pin holes of a corresponding socket.

In accordance with an embodiment of the present disclosure, a method includes placing a system-on-wafer structure in a testing system, the system-on-wafer structure including integrated circuit dies, a redistribution structure connected to the integrated circuit dies, external connectors connected to the redistribution structure by first conductive connectors, and sockets connected to the redistribution structure by second conductive connectors, each socket including pin holes, electrically connecting the testing system to the external connectors, connecting test structures to the sockets, wherein each test structure includes pins extending from a substrate, wherein connecting each test structure to each socket includes inserting pins of the test structure into corresponding pin holes of the respective socket to form a first continuous conductive path through the pins of the test structure and through the second conductive connectors of the respective socket, and using the testing system, performing an electrical test on the system-on-wafer structure. In an embodiment, performing an electrical test includes testing the continuity of the first continuous conductive path through the second conductive connectors. In an embodiment, performing an electrical test includes testing the continuity of a second continuous conductive path through the first conductive connectors of an external connector. In an embodiment, performing an electrical test includes testing the continuity of a third continuous conductive path through the integrated circuit dies. In an embodiment, performing an electrical test includes forming a continuous conductive path from a first external connector of the system-on-wafer structure to a second external connector of the system-on-wafer structure that passes through the redistribution structure of the system-on-wafer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A testing system comprising:
   a load board comprising:
      a first circuit board;
      a first external connector attached to the first circuit board; and a thermal module attached to the first circuit board, wherein the thermal module is configured to hold a system-on-wafer structure comprising a connector and a socket, wherein the connector and the socket are on a first side of the system-on-wafer structure;

a connector structure comprising:
a second circuit board, wherein the second circuit board is electrically connected to the first external connector; and
a second external connector on the second circuit board, wherein the second external connector is configured to physically and electrically connect to the connector of the system-on-wafer structure; and a test structure configured to physically and electrically connect to the socket of the system-on-wafer structure, the test structure comprising a third circuit board and pins extending from the third circuit board, wherein adjacent pairs of pins of the test structure are electrically coupled through the third circuit board to form a continuous conductive path extending alternately between the system-on-wafer structure and the adjacent pairs of pins of the test structure.

2. The testing system of claim 1, wherein the connector structure is configured to form a continuous conductive path extending alternately between the system-on-wafer structure and the connector structure.

3. The testing system of claim 1, further comprising a thermal foam between the thermal module and the first circuit board.

4. The testing system of claim 3, wherein the system-on-wafer structure is secured to the thermal module by bolts, wherein the bolts extend into the thermal foam.

5. The testing system of claim 1, wherein the second circuit board is electrically connected to the first external connector by wiring.

6. The testing system of claim 1, wherein the connector structure is configured to transmit electrical testing signals between the first circuit board and the system-on-wafer structure.

7. The testing system of claim 1, wherein the second external connector comprises the same type of connector as the connector of the system-on-wafer structure.

8. The testing system of claim 1, wherein the connector structure comprises a third external connector, wherein the second circuit board is electrically connected to the first external connector through the third external connector.

9. A method comprising:
securing a device to a load board, wherein the device comprises a plurality of external connectors and a plurality of sockets;
performing an electrical test process on the device, comprising:
connecting first test connectors to respective external connectors of the device, wherein the first test connectors electrically couple the device to the load board;
inserting second test connectors into respective sockets of the device to form conductive paths, wherein each of the second test connectors is electrically coupled to the respective socket by a plurality of interconnections between the second test connector and the respective socket; wherein each conductive path is a continuous conductive path through one of the second test connectors and a respective socket, wherein each conductive path comprises a plurality of path segments connected in a series, wherein each path segment comprises a respective interconnection between the second test connector and the corresponding socket; and
sending an electrical signal from the load board to the device; and
after performing the electrical test process, removing the first test connectors from the external connectors, removing the second test connectors from the sockets, and removing the device from the load board.

10. The method of claim 9, wherein securing the device to the load board comprises securing the device to a cold plate attached to the load board.

11. The method of claim 9, wherein sending the electrical signal comprises sending the electrical signal along at least one conductive path.

12. The method of claim 9, wherein the electrical test process comprises an electrical continuity test through the conductive paths.

13. The method of claim 9, wherein the conductive paths are connected in a series.

14. The method of claim 9, wherein, after connecting the second test connectors to the sockets, the second test connectors are electrically connected through the device.

15. The method of claim 9, wherein connecting the second test connectors to the sockets comprises inserting pins of each second test connector into pin holes of a corresponding socket.

16. A method comprising:
placing a system-on-wafer structure in a testing system, the system-on-wafer structure comprising:
integrated circuit dies;
a redistribution structure connected to the integrated circuit dies;
external connectors connected to the redistribution structure by first conductive connectors; and
sockets physically and electrically connected to the redistribution structure by second conductive connectors, each socket comprising pin holes;
electrically connecting the testing system to the external connectors;
connecting test structures to the sockets, wherein each test structure comprises pins extending from a respective substrate, wherein connecting each of the test structures to each of the sockets comprises inserting pins of the test structure into corresponding pin holes of the respective socket to form a first continuous conductive path through the pins of the test structure and through the second conductive connectors of the respective socket, wherein the substrate of each test structure is physically and electrically isolated from the substrates of any adjacent test structures; and
using the testing system, performing an electrical test on the system-on-wafer structure.

17. The method of claim 16, wherein performing an electrical test comprises testing continuity of the first continuous conductive path through the second conductive connectors.

18. The method of claim 16, wherein performing an electrical test comprises testing continuity of a second continuous conductive path through the first conductive connectors of an external connector.

19. The method of claim 16, wherein performing an electrical test comprises testing continuity of a third continuous conductive path through the integrated circuit dies.

20. The method of claim 16, wherein performing an electrical test comprises forming a continuous conductive path from a first external connector of the system-on-wafer structure to a second external connector of the system-on-wafer structure that passes through the redistribution structure of the system-on-wafer structure.

\* \* \* \* \*